United States Patent [19]

Igarashi et al.

[11] Patent Number: 5,814,894
[45] Date of Patent: Sep. 29, 1998

[54] SEMICONDUCTOR DEVICE, PRODUCTION METHOD THEREOF, AND TAPE CARRIER FOR SEMICONDUCTOR DEVICE USED FOR PRODUCING THE SEMICONDUCTOR DEVICE

[75] Inventors: Kazumasa Igarashi; Megumu Nagasawa; Satoshi Tanigawa; Hideyuki Usui; Nobuhiko Yoshio; Hisataka Ito; Tadao Okawa, all of Osaka, Japan

[73] Assignee: Nitto Denko Corporation, Osaka, Japan

[21] Appl. No.: 627,996

[22] Filed: Apr. 4, 1996

[30] Foreign Application Priority Data

Apr. 7, 1995 [JP] Japan ..................................... 7-082895
Oct. 31, 1995 [JP] Japan ..................................... 7-283642

[51] Int. Cl.⁶ .................................................. H01L 23/28
[52] U.S. Cl. .......................... 257/787; 257/778; 257/792; 528/310; 528/318
[58] Field of Search ..................................... 257/787, 792, 257/738, 778, 791; 528/310, 318

[56] References Cited

U.S. PATENT DOCUMENTS

| | | | |
|---|---|---|---|
| 4,989,063 | 1/1991 | Kolesar, Jr. | 257/792 |
| 5,442,240 | 8/1995 | Mukerji | 257/792 |
| 5,450,283 | 9/1995 | Lin et al. | 257/787 |
| 5,497,033 | 3/1996 | Fillion et al. | 257/792 |
| 5,554,887 | 9/1996 | Sawai et al. | 257/787 |
| 5,641,996 | 6/1997 | Omaya et al. | 257/787 |
| 5,650,593 | 7/1997 | McMillan et al. | 257/787 |
| 5,656,863 | 8/1997 | Yasunaga et al. | 257/787 |
| 5,677,566 | 10/1997 | King et al. | 257/787 |
| 5,684,330 | 11/1997 | Lee | 257/787 |

*Primary Examiner*—David Ostrowski
*Attorney, Agent, or Firm*—Sughrue, Mion, Zinn. Macpeak & Seas, PLLC

[57] ABSTRACT

A semiconductor device capable of preventing the occurrence of defect of electroconductivity, wherein a semiconductor chip 1 equipped with electrodes 11 is mounted on an auxiliary wiring plate 2 in the state of facing the surface of the electrode 11 side, leading conductors 23 are disposed in the inside of the auxiliary wiring plate 2, one end of each leading conductor 23 forms an internal electrode 21 projecting from the surface of the auxiliary wiring plate 2 at the side of mounting the semiconductor chip 1, the other end of the leading conductor 23 forms an external electrode 22 projecting from the surface of the auxiliary wiring plate opposite to the side of mounting the semiconductor chip 1, and each of the internal electrodes 21 is connected to each of the electrodes 11 of the semiconductor chip 1, at least a gap between the semiconductor chip 1 and the auxiliary wiring plate 2 is encapsulated with a heat-welding polyimide resin layer.

28 Claims, 10 Drawing Sheets

SEMICONDUCTOR DEVICE, PRODUCTION METHOD THEREOF, AND TAPE CARRIER FOR SEMICONDUCTOR DEVICE USED FOR PRODUCING THE SEMICONDUCTOR DEVICE

FIELD OF THE INVENTION

The present invention relates to a semiconductor device of a chip scale package (hereinafter referred to as "CSP") type, and more specifically to a semiconductor device of a CSP type excellent in moistureproof reliability, a production method thereof, and a tape carrier for semiconductor device used for producing the semiconductor device.

BACKGROUND OF THE INVENTION

As a package-type semiconductor device, a semiconductor device having a structure that a semiconductor chip is loaded on the die pad of a lead frame, the semiconductor chip is connected to an inner lead by wire bonding, an outer lead is removed, and the semiconductor chip and the lead frame are encapsulated with a resin is known as a general one. However, in the semiconductor device of this type, it is required to considerably widen the pitch between the lead frame and the outer lead, whereby large sizing of the package cannot be avoided, which becomes disadvantageous for high-density packaging.

For solving the problem, various semiconductor devices of the CSP type each having a small-sized package scale have been developed. For example, there is a CSP-type semiconductor device shown in FIG. 12 of the accompanied drawings. In the semiconductor device, on the surface of an insulating support plate 25' is mounted a semiconductor chip 1' in the state that the circuit-formed surface having electrodes 11' faces the insulating support plate 25' and the semiconductor chip 1' is encapsulated with a cured resin 4 having almost the same size as that of the semiconductor chip 1'. The semiconductor chip 1' has electrodes 11' at the bottom thereof. In the semiconductor device, leading conductors 24' are formed by printing at definite positions of the surface of the insulating support plate 25' at the side of mounting the semiconductor chip 1', one end of each of the leading conductors 24' is connected to one end of a metal bump 211' and the other end of the metal bump 211' is fixed with each of the electrodes 11' of the semiconductor chip 1'. Also, the other end of each of the leading conductors 24' extends to a hole 221' formed at a definite position of the insulating support plate 25', a soft solder 222' is filled in the hole 221', and one end of the soft solder 221' is connected to the other end of the leading conductor 24'. Also, the other end of the soft solder 221' filled in the hole 221' is projected from the surface of the insulating support plate 25' at the opposite side to the semiconductor chip mounted side and the projected portion of the soft solder 221' forms a solder bump 223' to constitute an external electrode 22'. Also, by utilizing the external electrode 22', the semiconductor device is packaged with a circuit substrate for packaging.

In the semiconductor device having the structure as described above, since the leading conductors to be formed on the insulating support plate 25' can be desirably formed, the solder bumps 223' for packaging can be formed at definite positions without being restricted by the dispositions of the electrodes 11' of the semiconductor chip 1' used. Thus, in the semiconductor device, the interval between the external electrodes 22' each other can be sufficiently widened to improve the soldering accuracy.

As described above, since in the CSP-type semiconductor device, high-density packaging is possible, the demand for the CSP-type semiconductor device tends to be increased at present. With the increase of the demand, for the CSP-type semiconductor device, the improvement of reliability has been required. Practically, the improvement of the reliability is to solve the problem of the occurrence of defect of electroconductivity between bump and chip in the CSP-type semiconductor device. It is supposed that the occurrence of the defect of electroconductivity is caused by the moisture absorption of the encapsulating resin. As described above, in the CSP-type semiconductor device, the semiconductor chip is mounted on the insulating support plate in the state that the circuit-formed surface of the semiconductor chip faces the insulating support plate and the gap between the semiconductor chip and the insulating support plate is encapsulated with an encapsulating resin, whereby the circuit-formed surface and connected portions are protected.

However, when a heat treatment such as packaging by soldering on a circuit substrate is applied to the semiconductor device, it sometimes happens that a gap forms in the interface between the back surface (circuit-formed surface) of the semiconductor chip and the encapsulating resin. Also, moisture absorbed by the encapsulating resin remains in the gap and is vaporized and expanded to form a pressure, whereby the encapsulating resin is cracked and the cracks become the passageways for the penetration of moisture, ions, etc. As a result, moisture, etc., penetrate into the semiconductor device to cause the defect of electroconductivity.

For overcoming the problem, various attempts have been proposed and practiced. For example, there is a method of removing moisture absorbed by the encapsulating resin by pre-drying the semiconductor device before the heat treatment such as soldering, etc. Also, there is a method of preventing the moisture absorption of the encapsulating resin by packing each semiconductor device with a moisture-proof bag directly before the heat treatment such as soldering, etc. However, in the pre-drying method, in the case of soldering several times the semiconductor device to the circuit substrate, it is required to carry out pre-drying each time, which is troublesome, and there is also a problem of managing the time for making soldering after pre-drying. On the other hand, in the method of packing each semiconductor device with a moisture-proof bag, there is a problem that a large cost is required for the moisture-proof bags to increase the cost for the semiconductor devices.

As other method, there is a method for improving the moisture absorbing property of the encapsulating resin itself but the method of improving the moisture absorbing property of the encapsulating resin capable of completely preventing the encapsulating resin from being cracked has not actually been completed at present.

SUMMARY OF THE INVENTION

The present invention has been made under such circumstances.

An object of the present invention is to provide a semiconductor device excellent in the moisture-proof reliability.

Another object of the present invention is to provide a method of producing the semiconductor device.

Further object of the present invention is to provide a tape carrier for semiconductor device used for the production of the semiconductor device.

It has now been found that the objects described above can be attained by the present invention as described hereinbelow.

That is, according to the first embodiment of the present invention, there is provided a semiconductor device, wherein a semiconductor chip equipped with at least one electrode is mounted on the surface of an auxiliary wiring plate in the state of facing the electrode side thereof, at least one leading conductor is disposed in the inside of the auxiliary wiring plate, one end of the leading conductor forms an internal electrode projecting from the surface of the auxiliary wiring plate at the semiconductor chip-mounting side, the other end of the leading conductor forms an external electrode projecting from the surface of the auxiliary wiring plate at the opposite side to the semiconductor chip-mounting side, and the internal electrode is connected to the electrode of the semiconductor chip, at least a gap between the semiconductor chip and the auxiliary wiring plate being encapsulated with a heat-welding polyimide resin layer.

According to the second embodiment of the present invention, there is provided a method of producing a semiconductor device, which comprises preparing an auxiliary wiring plate, a semiconductor chip having at least one electrode, and a heat-welding polyimide film; the auxiliary wiring plate being for mounting thereon the semiconductor chip and having the construction that at least one leading conductor is disposed in the inside thereof, one end of the leading conductor forms an internal electrode projecting from the surface of the auxiliary wiring plate at the side for mounting the semiconductor chip, and the other end of the leading conductor forms an external wiring electrode projecting from the surface of the auxiliary wiring plate at the opposite side to the side of mounting the semiconductor chip; mounting the semiconductor chip on the auxiliary wiring plate in the state of the electrode side thereof being the lower side via the heat-welding polyimide film; melting the heat-welding polyimide film by press-contacting the auxiliary wiring plate and the semiconductor chip each other while heating in the state, and curing the resin to form a heat-welding polyimide resin layer, whereby the gap between the auxiliary wiring plate and the semiconductor chip is encapsulated, and at encapsulating or after encapsulating, connecting the internal electrode of the auxiliary wiring plate to the electrode of the semiconductor chip.

According to the third embodiment of the present invention, there is provided a method of producing a semiconductor device, which comprises preparing an auxiliary wiring plate and a semiconductor chip equipped with at least one electrode, the auxiliary wiring plate being for mounting thereon the semiconductor chip and having the construction that at least one leading conductor is disposed in the inside thereof, one end of the leading conductor forms an internal electrode projecting from the surface of the auxiliary wiring plate at the side for mounting the semiconductor chip, the other end of the leading conductor forms an external wiring electrode projecting from the surface of the auxiliary wiring plate at the opposite side to the side of mounting the semiconductor chip, and a heat-welding polyimide film is formed on the surface thereof at the side of mounting the semiconductor chip; mounting the semiconductor chip on the heat-welding polyimide film of the auxiliary wiring plate in the state that the surface of the electrode side of the semiconductor chip faces the heat-welding polyimide film; melting the heat-welding polyimide film by press-contacting the auxiliary wiring plate and the semiconductor chip each other while heating in the state, curing the resin to form a heat-welding polyimide resin layer, whereby the gap between the auxiliary wiring plate and the semiconductor chip is encapsulated, and at encapsulating or after encapsulating, connecting the internal electrode of the auxiliary wiring plate to the electrode of the semiconductor chip.

According to the fourth embodiment of the present invention, there is further provided a tape carrier for semiconductor device, wherein at least one leading conductor is disposed in the inside of a high-molecular weight film, one end of the leading conductor forms an internal electrode projecting from the surface of the high-molecular weight film, the other end of the leading conductor forms an external electrode projecting from the back surface of the high-molecular weight film, and the surface of the high-molecular weight film including the surface of the internal electrode is covered with a heat-welding polyimide film formed by at least one of heat-welding polyimides each represented by the following formulae (1) to (5);

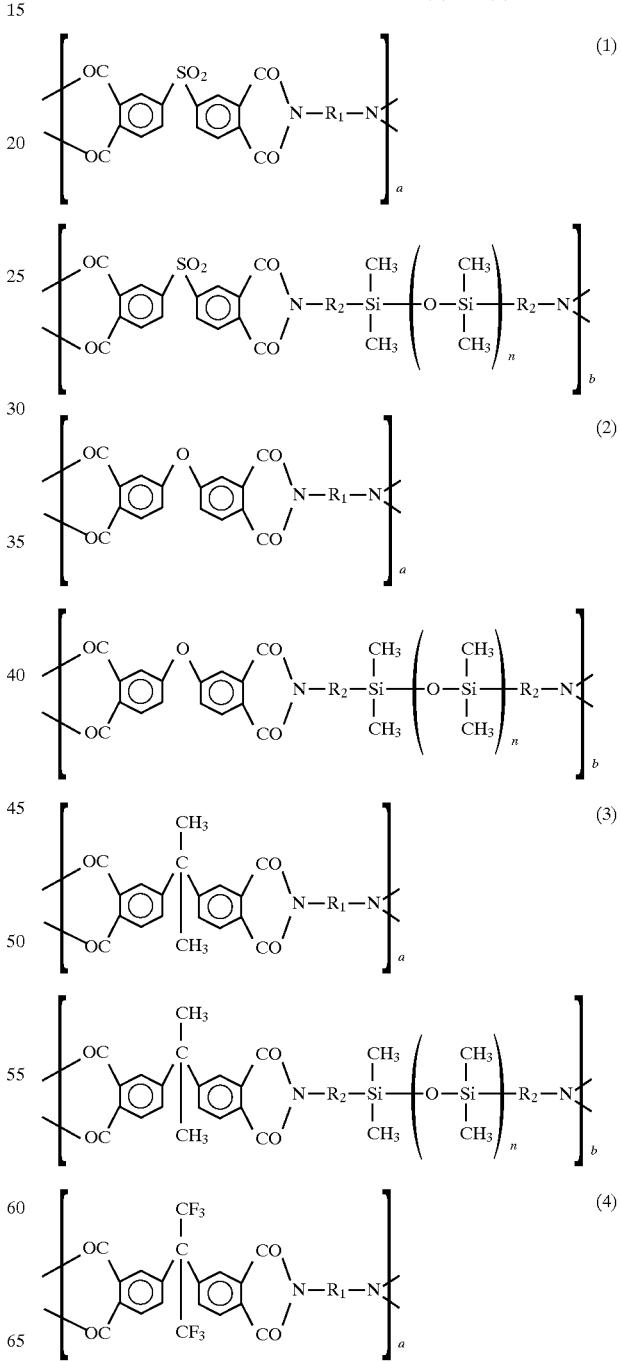

-continued

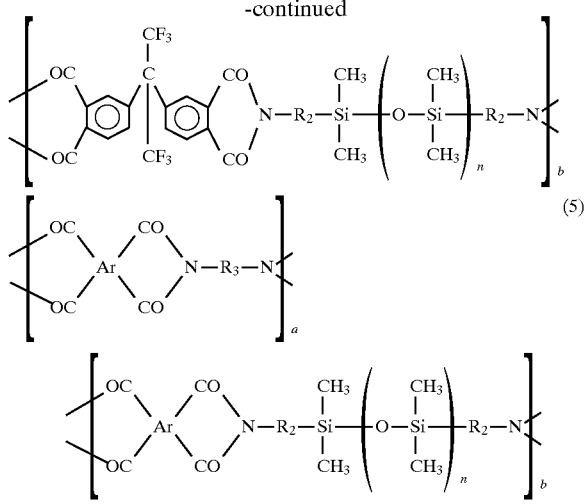

In the formulae (1) to (5), $R_1$ represents

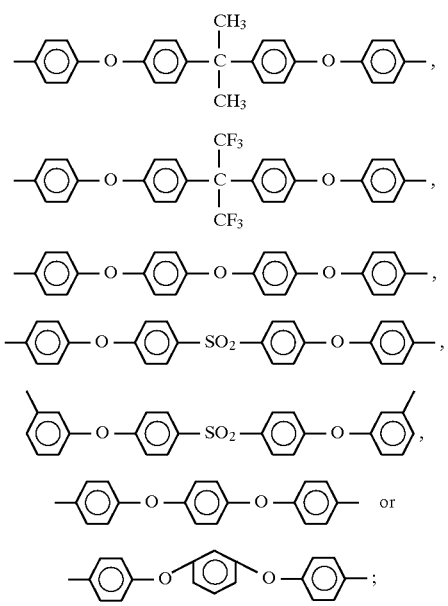

$R_2$ represents $—C_3H_6—$, $—C_4H_8—$, or

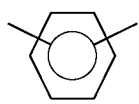

; $R_3$ represents an aromatic silicon-free diamine residue; Ar represents an aromatic tetracarboxylic acid residue; n represents an integer of from 1 to 100; a and b are numbers satisfying the relationship of a+b=1 and the relationship of $0.3 \leq a/(a+b) \leq 1.00$; and the heat-welding polyimide represented by the formulae (1) to (5) may be a random copolymer or a block copolymer.

The aromatic silicon-free diamine residue represented by $R_3$ above generally has a molecular weight of from about 100 to 1000. Preferably, the residue represented by $R_1$ above is used as the aromatic silicon-free diamine residue, $R_3$.

The aromatic tetracarboxylic acid residue represented by Ar above has a molecular weight of from about 50 to 1,000, and preferably from 100 to 500.

n is an integer of from 1 to 100 as described above, but since a compound of the formula (15) described after is generally used in the form of a mixture of compounds having different n, n on the average is preferably from 2 to 10.

The relationship between a and b is generally the relationship described above, and a and b are preferably numbers satisfying the relationship of $0.5 \leq a/(a+b) \leq 0.9$.

According to the fifth embodiment of the present invention, there is also provided a tape carrier for semiconductor device, wherein at least one leading conductor is disposed in the inside of a high-molecular weight film, one end of the leading conductor forms an internal electrode projecting from the surface of the high-molecular weight film, the other end of the leading conductor forms an external electrode projecting from the back surface of the high-molecular weight film, the surface of the high-molecular weight film excluding the surface of the internal electrode is covered with a heat-welding polyimide film formed from one of heat-welding polyimides each represented by the formulae (1) to (5) described above, and the internal electrode projects from the surface of the heat-welding polyimide film.

The inventors made a series of investigations for the improvement of encapsulating resins and the improvement of the adhesion of a semiconductor chip and an auxiliary wiring plate as the main theme. This is the result of the judgement that the conventional solving methods of preventing the moisture absorption of semiconductor devices, improving the moisture-absorbing property of encapsulating resins, etc., are not fundamental solving methods. That is, this is because the occurrence of cracks in a semiconductor device is caused by the occurrence of a gap between a semiconductor chip and an encapsulating resin, and if the occurrence of the gap is prevented by increasing the adhesive force of the encapsulating resin, moisture does not remain and the occurrence of the cracks by heat treatment can be prevented.

Thus, when the investigations were continued based on the idea, it has been found that in the semiconductor device encapsulating the gap between the semiconductor chip and the auxiliary wiring plate by forming a heat-welding polyimide resin layer, the polyimide resin layer strongly adheres to the semiconductor chip and the auxiliary wiring plate. Also, it has further been found that the semiconductor device having the heat-welding polyimide resin layer becomes excellent in the reliability. The present invention has been accomplished based on those findings.

Also, as a method of forming the heat-welding polyimide resin layer in the gap between the semiconductor chip and the auxiliary wiring plate, the two kinds of the production methods described above were developed. That is, they are the method of interposing the heat-welding polyimide resin layer between the semiconductor chip and the auxiliary wiring plate in the case of mounting the semiconductor chip on the auxiliary wiring plate and the method of using the auxiliary wiring plate having formed on the surface thereof at the side of mounting the semiconductor chip the heat-welding wiring plate.

In addition to the production methods, the inventors have also developed a tape carrier for semiconductor device for producing more efficiently the semiconductor device wherein the gap between the semiconductor chip and the auxiliary wiring plate is encapsulated with the heat-welding polyimide resin layer. The tape carrier for semiconductor device comprises a high-molecular weight film which has at least one leading conductor formed in the inside thereof and one surface of which is covered by a heat-welding polyimide film. When a semiconductor chip is disposed on the heat-welding polyimide film of the tape carrier for semiconductor device and the tape carrier for semiconductor device is press-contacted with the semiconductor chip each other while heating them, the heat-welding polyimide film is melted and welded to the semiconductor chip and the auxiliary wiring plate. By curing the molten heat-welding polyimide film by cooling, etc., a heat-welding polyimide resin layer is formed and the gap between the semiconductor chip and the auxiliary wiring plate is encapsulated by the cured polyimide resin layer.

In the semiconductor device, the production method of the semiconductor device, and the tape carrier for semiconductor device of the present invention, by using a heat-welding polyimide having a specific chemical structure, the adhesive force between the encapsulating resin (the heat-welding polyimide resin layer) and the semiconductor chip or the auxiliary wiring plate can be improved and the occurrence of the defect of electroconductivity in the semiconductor device is effectively prevented.

Furthermore, in the present invention, by forming a primer layer between the heat-welding polyimide resin layer and the auxiliary wiring plate, the adhesive property of the heat-welding polyimide resin layer and the auxiliary wiring plate is more improved. Also, by imparting a definite surface tension to the surface of the auxiliary wiring plate or making the surface thereof uneven, the adhesive force of the heat-welding polyimide resin layer and the auxiliary wiring plate is improved.

DETAILED DESCRIPTION OF THE INVENTION

The present invention is described in detail below.

First, the semiconductor device of the present invention is explained.

Figure 1A:
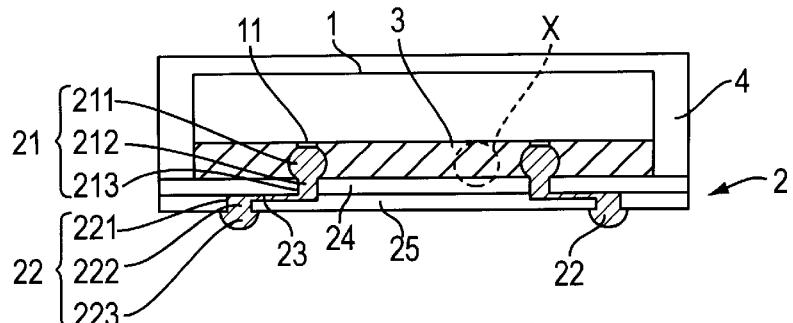
FIG. 1(A) is a cross sectional view showing an embodiment of the semiconductor device of the present invention, FIG. 1(A') ross sectional view showing another embodiment of the semiconductor device of the present invention, FIG. 1(A") is partially enlarged sectional view of the semiconductor device shown in (A')
Figure 1A:
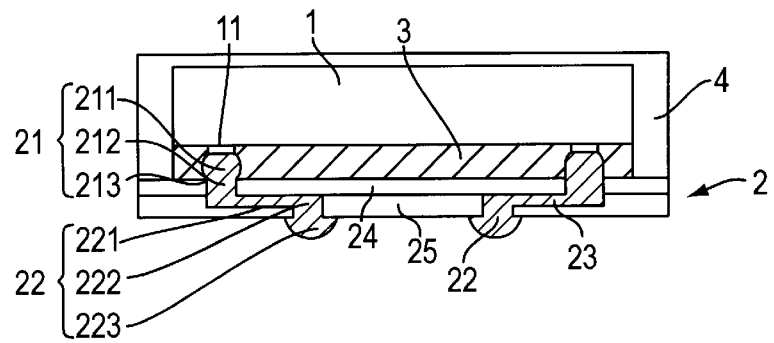
Figure 1A:
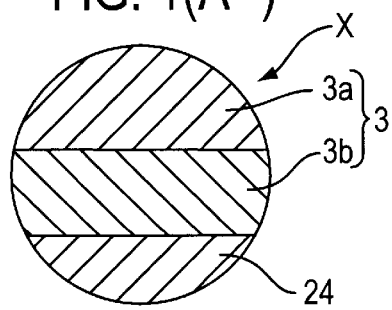
Figure 1B:
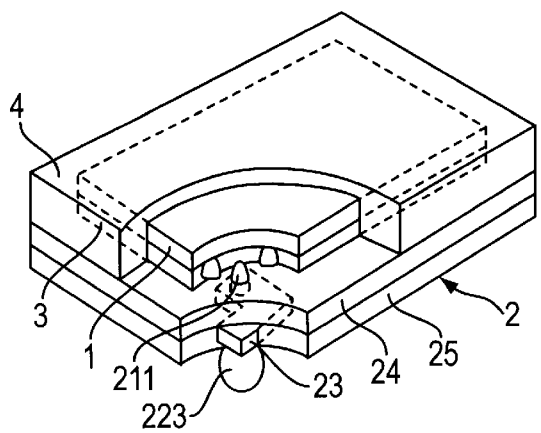
FIG. 1(B) is a slant view, with parts broken away, of the above embodiment of the semiconductor device of the present invention.

FIGS. 1(A) and (B) show an embodiment of the semiconductor device of the present invention. FIG. 1(A) is a cross sectional view showing the configuration of the semiconductor device, and FIG. 1(B) is a slant view, with parts broken away, thereof. As shown in the figures, the semiconductor device is of a CSP type, wherein a semi-conductor chip 1 is mounted on the surface of an auxiliary wiring plate 2 in the state that the electrodes 11 side (circuit-formed surface side) faces the surface of the auxiliary wiring plate. The auxiliary wiring plate 2 comprises a laminate of insulating layers 24 and 25 and for the insulating layers 24 and 25, a polyimide film is preferably used from the view point of a heat resistance. Each of the electrodes 11 of the semiconductor chip 1 is connected to each of internal electrodes 21 of the auxiliary wiring plate 2. The internal electrode 21 is formed by filling a metal 213 in a hole 212 formed at a definite position of the insulating layer 24 and projecting (upward in the figure) one end of the filled metal from the surface of mounting thereon the semiconductor chip 1 in a bump form to form a metal bump 211. Other end of the filled metal 213 described above is connected to one end of a leading conductor 23 disposed in the inside of the auxiliary wiring plate 2. The other end of the leading conductor 23 is connected to an external electrode 22. The external electrode 22 is formed by filling a metal 222 in a hole 221 formed at a definite portion of the insulating layer 25, one end of the filled metal 222 being connected to an end of the leading conductor 23, and projecting (downward in the figure) the other end of the filled metal 222 from the surface of insulating layer 25 at the opposite side to the side of mounting the semiconductor chip 1 in a bump form to form a metal bump 223 as the case of the internal electrode 21 described above.

Thus, the semiconductor 1 is electrically connected to an outside members through the internal electrodes 21 of the auxiliary wiring plate 21, the leading conductor 23, and the external electrodes 22. The feature of the semiconductor device is that since the leading conductors 23 can be optionally formed, the positions of forming the internal electrodes 21 and the external electrodes 23 can be desirably selected, whereby regardless of the kind of the semiconductor device, the semiconductor device can be standardized and the application of the semiconductor device onto a circuit substrate to be packaged covers a wide range.

FIG. 1(A') shows an embodiment of the semiconductor device having different electrode positions from those of the semiconductor device shown by FIG. 1(A). In FIG. 1(A'), the same portions as those of FIG. 1(A) are shown by the same numerals.

In the semiconductor device described above, the whole surfaces of the semiconductor chip 1 excluding the circuit-formed surface (the surface of the electrode 11 side) are encapsulated with a resin 4. As the resin 4, an epoxy resin, etc., usually used for ordinary packaging are used, but the heat-welding polyimide resin described below may be used. Also, the noteworthy point in the semiconductor device is the point that the gap between the semiconductor chip 1 and the auxiliary wiring plate 2 is encapsulated with the heat-welding polyimide resin layer 3. Since the heat-welding polyimide resin layer 3 is strongly adhered to the semiconductor chip 1 and the auxiliary wiring plate 2, in the case of applying the heat treatment such as soldering packaging to a circuit substrate, the occurrence of a gap between the semiconductor chip 1 and the heat-welding polyimide resin layer 3, etc., is prevented.

As the material for forming the heat-welding polyimide resin layer, a heat-welding polyimide resin having a glass transition temperature of 300° C. or less is preferred and a heat-welding polyimide resin having a glass transition temperature of from 150° C. to 250° C. is particularly preferred. Also, the heat-welding polyimide resins represented by the following formulae (1) to (5) and having the glass transition temperature described above are most suitable.

In addition, the heat-welding polyimide resins represented by the formulae (1) to (5) are preferably modified with a silicone but may not be silicone-modified. That is, in the formulae (1) to (5) described below, when a/(a+b)=1, the resins represented by the formulae become the unmodified heat-welding polyimide resin. Thus, both the resins are compared. That is, the silicone-modified heat-welding polyimide resin is excellent in the adhesive force and the prevention of the occurrence of the defect of electroconductivity. On the other hand, the unmodified heat-welding polyimide resin is excellent in the adhesive force under high temperature at reflow soldering. In addition, the silicone-modified heat-welding polyimide resin is inferior to the unmodified heat-welding polyimide resin in the adhesive force under high temperature but yet shows a sufficient adhesive force under high temperature as compared with other resins. Accordingly, in both the resins, by using the silicone-modified heat-welding polyimide resin, better results can be obtained.

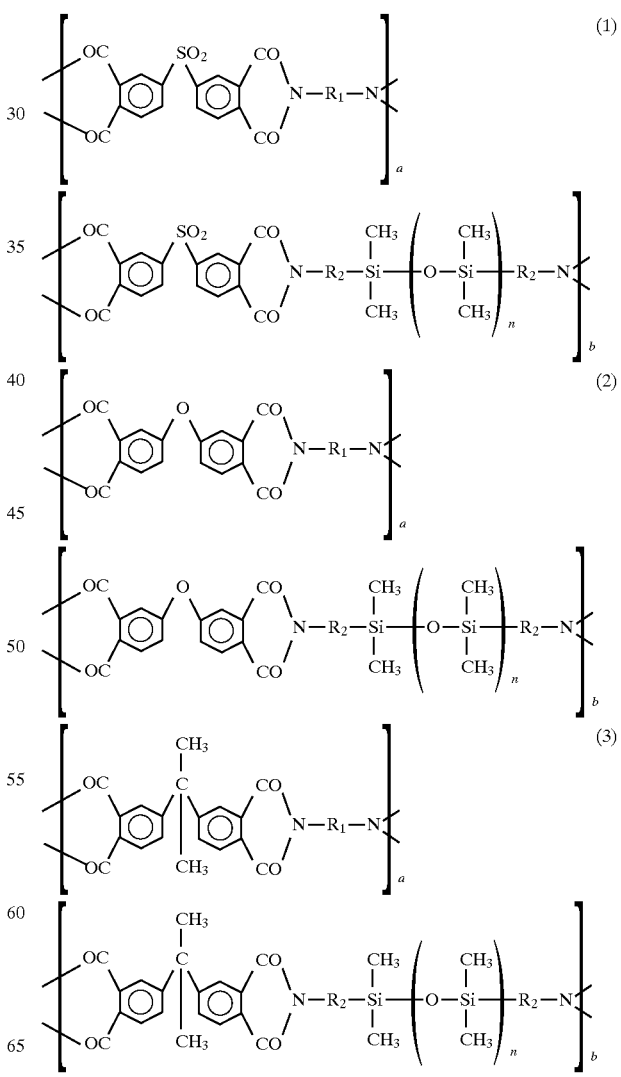

-continued

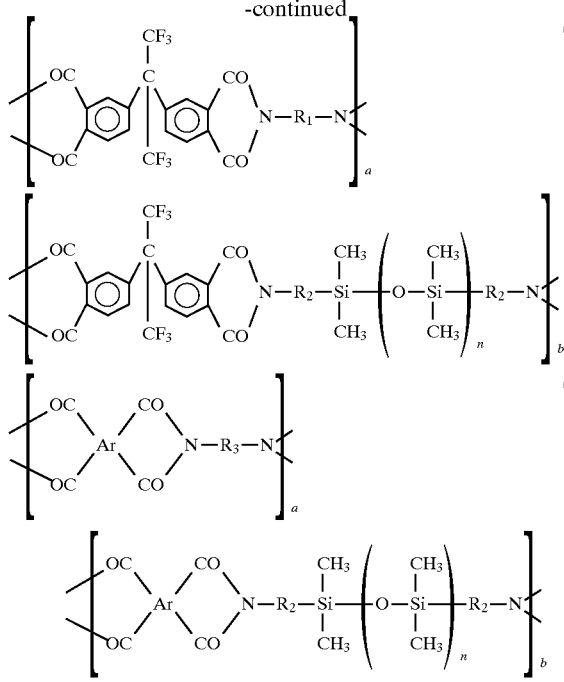

In the above formulae (1) to (5), $R_1$ represents

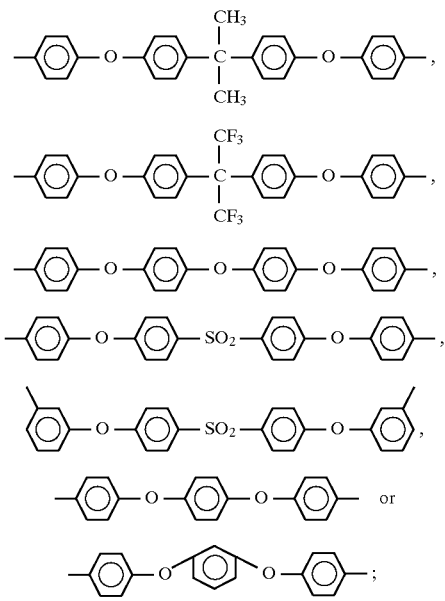

$R_2$ represents $—C_3H_6—$, $—C_4H_8—$, or

$R_3$ represents an aromatic silicon-free diamine residue; Ar represents an aromatic tetracarboxylic acid residue; n represents an integer of from 1 to 100; a and b represent numbers satisfying the relationship of a+b=1 and the relationship of $0.3 \leq a/(a+b) \leq 1.00$; and each polyimide resin represented by the formulae (1) to (5) may be a random copolymer or a block copolymer.

The aromatic silicon-free diamine residue represented by $R_3$ above generally has a molecular weight of from about 100 to 1,000. Preferably, the residue represented by $R_1$ above is used as the aromatic silicon-free diamine residue, $R_3$.

The aromatic tetracarboxylic acid residue represented by Ar above has a molecular weight of from about 50 to 1,000, and preferably from 100 to 500.

n is an integer of from 1 to 100 as described above, but since a compound of the formula (15) described after is generally used in the form of a mixture of compounds having different n, n on the average is preferably 2 to 10.

The relationship between a and b is generally the relationship described above, and a and b are preferably numbers satisfying the relationship of $0.5 \leq a/(a+b) \leq 0.9$.

In the semiconductor device of the present invention, it is preferred to form a primer layer between the heat-welding polyimide resin layer and the auxiliary wiring plate. That is, in the semiconductor device, as shown in FIG. 1(A") which is the enlarged sectional view of portion X of FIG. 1(A), the heat-welding polyimide resin layer 3 has a double layer structure comprising a laminate of a heat-welding polyimide resin layer 3a and a primer layer 3b and the primer layer 3b is in contact with the insulating layer 24. By employing such a layer structure, the adhesive property of the heat-welding polyimide resin layer 3 (3a and 3b) and the auxiliary wiring plate 2 (24 and 25) is improved and the reliability of the semiconductor device is improved.

Also, the area of the auxiliary wiring plate is preferably the same as the bottom area (the area of the circuit-formed surface, usually (3 to 20) mm×(3 to 20) mm) of the semiconductor chip 1 or less than 200% of that, and is particularly preferably less than 130% of that. This is because if the auxiliary wiring plate is larger than the semiconductor chip, the packaging density is lowered, whereby the advantages of the CSP-type semiconductor device are not effectively obtained.

The interval of the external electrodes 22 each other is preferably as wide as possible for preventing the formation of bridge at soldering the semiconductor device to a circuit substrate for packaging. Also, the interval of external electrodes each other is usually the same interval.

Figure 2:
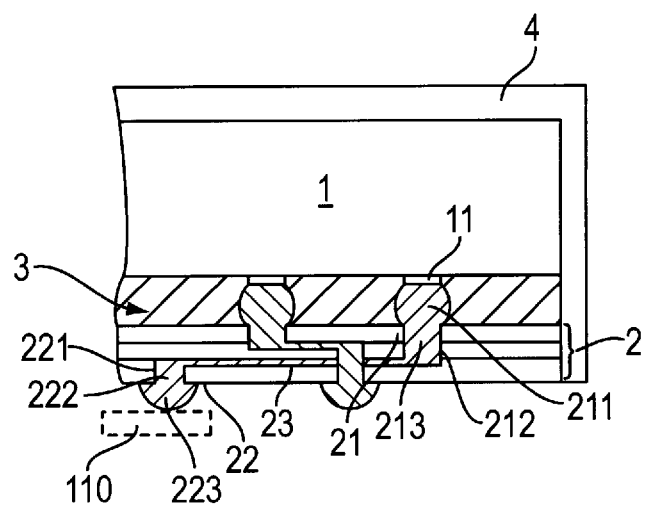
FIG. 2 is a cross sectional view showing a part of an embodiment of the semiconductor device of the present invention, wherein a auxiliary wiring plate has a multilayer structure.

FIG. 2 shows an embodiment of the semiconductor device of the present invention, wherein an auxiliary wiring plate 2 is a three-layer structure. In FIG. 2, numeral 110 shows the electrode of a circuit substrate for packaging (not shown) and other portions than the electrode 110 corresponding to the same portions as FIG. 1 are shown by the same numerals. As shown in FIG. 2, in the auxiliary wiring plate 2, the insulating layer comprises three laminated layers and in each interface portion of the insulating layers is formed at least one leading conductor 23. By employing a multilayer structure as the auxiliary wiring plate 2, the portions of forming the leading conductors in the interfaces of the layers can be increased, which can adequately cope with a multi-electrode semiconductor chip 1 having a high integrated circuit. Accordingly, the structure of the auxiliary circuit plate 2 is not limited to a double layer structure and a three-layer structure and the number of the layers is determined by the kind of the semiconductor chip to be mounted.

Also, in the semiconductor device of the present invention, for increasing the adhesive force at the interface between the auxiliary wiring plate and the encapsulating resin (the heat-welding polyimide resin layer), it is preferred that at least the portion of the surface of the auxiliary wiring plate at the semiconductor chip-mounting side, the portion being brought into contact with the heat-welding polyimide resin layer, is in a state having a definite surface tension and has a definite uneven surface. Practically, the surface tension is usually 35 mJ/m$^2$ or more, and preferably 40 mJ/m$^2$ or more. Also, the uneven surface is usually an uneven surface of from 0.005 to 0.5 μm in diameter, and preferably an uneven surface of from 0.01 to 0.2 in diameter.

By employing such definite conditions, the adhesive force at the interface(s) can be increased to more than 300 g/cm, preferably more than 500 g/cm, and more preferably more than 1000 g/cm at a 90° peeling strength and as a result thereof, the occurrence of the defect of electroconductivity can be more effectively prevented.

As a method of giving such definite conditions to the surface of the auxiliary wiring plate, there are a chemical method such as a treatment with an acid or alkaline solution, a treatment with a coupling agent, a graft treatment, etc., and a physical treatment such as a corona discharging treatment, a high-frequency plasma treatment, an ion etching treatment, etc.

The semiconductor device described above can be produced by the production method of the present invention. As the production method of semiconductor of the present invention, there are two kinds of methods, i.e., a first production method and a second production method.

First, an embodiment of the first production method is described based on FIG. 3.

FIGS. 3(A) to (I) show the process of producing a semiconductor device by the first production method of the present invention.

Figure 3A:
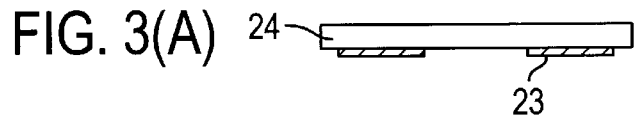
FIG. 3(A) is a configurational view showing the state that leading conductors are formed under an insulating layer.

First, as shown in FIG. 3(A), a leading conductor 23 is formed by printing on one surface of an insulating support film (insulating layer) 24. For the formation of the leading conductor 23 by printing, it is preferred to use a method of chemically etching a metal foil of a metal foil-laminated synthetic resin film in a definite leading pattern. As the metal foil-laminated synthetic resin film, there are a double layer substrate obtained by welding a copper foil on a synthetic resin film or adhering a copper foil on a synthetic resin film using a varnish solution, a three-layer substrate obtained by adhering a copper foil on a synthetic resin film with a thermoplastic or thermosetting adhesive, etc.

There is no particular restriction on the synthetic resin film used in this case if the resin film has a sufficient heat resistance in the case of forming metal bumps by a wire bumping method and a sufficient chemical resistance in the case of forming metal bumps by a plating method. Examples of the synthetic resin film are a polyimide film, a polyethylene terephthalate film, a polyether film, a polyether sulfone film, a polyphenylene sulfide film, a polyether ether ketone film, a polytetrafluoroethylene (Teflon) film, etc. In these synthetic resin films, a polyimide film having a good heat resistance is preferred as described hereinbefore. In addition, the thickness of the synthetic resin film is usually from 10 μm to 150 μm, and preferably from 12.5 μm to 50 μm.

Figure 3B:
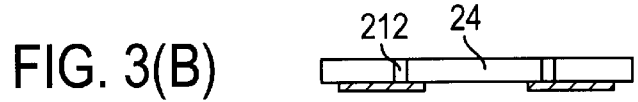
FIG. 3(B) is a configurational view showing the state that holes are formed in the insulating layer.

After forming the leading conductors 23 on one surface of the insulating support film 24, as shown in FIG. 3(B), holes 212 are formed at definite positions of the insulating support film 24. For the formation of holes, drill processing, laser etching processing, etc., is generally applied. In particular, when the insulating support film 24 is a polyimide film, a wet perforation method such as alkali etching, etc., can be applied. Also, in the case of a polyimide film of a double layer substrate, a photosensitive polyimide is used and the polyimide film can be perforated by a light exposure.

Figure 3C:
FIG. 3(C) is a configurational view showing the state that a metal is filled in the holes.

After forming the holes 212, as shown in FIG. 3(C), a plating process is carried out in the holes 212 using the insulating support film as a plating mask and using the conductors 23 as the precipitation bases to fill a metal 213. Examples of the metal include gold, silver, nickel, copper, and palladium.

Figure 3D:
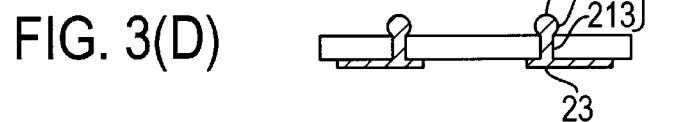
FIG. 3(D) is a configurational view showing the state that a metal bump is formed on the end surface of the above filled metal.

After filling the metal 213, as shown in FIG. 3(D), a metal bump 211 is formed on the surface of the exposed end (the upper end surface in the figure) of each filled metal 213. As a method of forming the metal bump 211, there is a method of melting the end of a gold wire, a copper wire, a solder wire, etc., to form a sphere and welding the spherical end portion onto the surface of the exposed end of the metal 213 using a wire bonder. When a gold wire is used, it is preferred for preventing the contact of the leading conductor 23 of copper and gold to use nickel as the filled metal 213. As other method than the method of using the wire bonder, the metal bump 211 can be formed by piling up a metal on the end surface of the filled metal by a wet plating method. When the metal bump 211 is formed using the wire bonder as described above, since the circumference of the hole 212 is a synthetic resin surface having a low wetting property to a molten metal, attaching the molten metal to the circumference of the hole 212 is prevented and thus a spherical metal bumps 211 each having a large contact angle can be regularly formed on the end surface of the filled metal 213. Also, by the plating method, the metal bumps 211 can be regularly formed regardless of the kind of electrolytic plating and electroless plating. By the formation of the metal bumps 211, the formation of internal electrodes 21 is finished. In addition, the height of the metal bump is usually from 5 μm to 150 μm, and preferably from 10 μm to 100 μm.

Figure 3E:
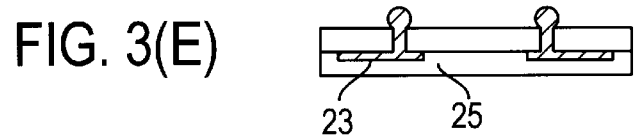
FIG. 3(E) is a configurational view showing the state that other insulating layer is laminated onto the insulating layer.
Figure 3F:
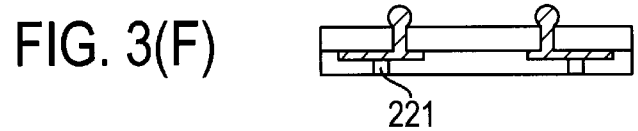
FIG. 3(F) is a configurational view showing that state that holes are formed in the laminated insulating layer.
Figure 3G:
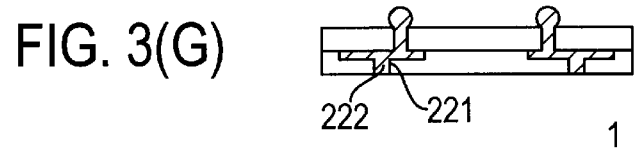
FIG. 3(G) is a configurational view showing the state that a metal is filled in the foregoing holes, (H') is a configurational view showing the state that semiconductor chip is mounted on the surface of the auxiliary wiring plate described above via a heat-welding polyimide film.
Figure 3G:
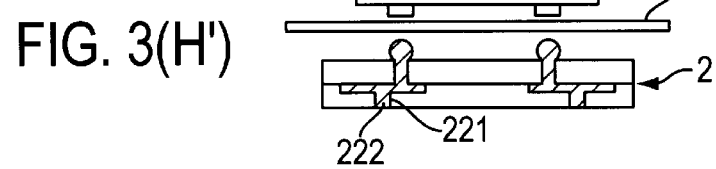

After forming the internal electrodes 21, as shown in FIG. 3(E), a covercoat insulating layer 25 is formed on the surfaces of the leading conductors 23 of the insulating support film 24 by covercoating a resin on the surfaces. As shown in FIG. 3(F), holes 221 for external electrodes are then formed at definite positions of the covercoat insulating layer 25 and as shown in FIG. 3(G), a metal (soft solder) 222 is filled in the holes 221. A series of these steps can be carried out as the case of forming the internal electrodes 21 described above.

Thus, an auxiliary wiring plate 2 can be produced.

As the material for forming the covercoat insulating layer, the same material as the insulating layer 24 can be used and from the view point of the heat resistance, a polyimide film is preferably used and a heat ring-closing film or a photosensitive ring-closing polyimide film is particularly preferred.

As shown in FIG. 3(H'), a semiconductor chip 1 is mounted on the auxiliary wiring plate 2 at the internal electrode 11 side via a heat-welding polyimide film 3 in the state that the surface of the electrode side thereof faces the auxiliary wiring plate. The auxiliary wiring plate 2 and the semiconductor chip 1 are press-contacted with each other while heating them to melt the heat-welding polyimide film and weld the polyimide film to both the elements, and the polyimide film is then cured by cooling. Thus, as shown in FIG. 3(H), a heat-welding polyimide resin layer 3 is formed to encapsulate the gap between the semiconductor chip 1 and the auxiliary wiring plate 2. In addition, at the formation of the heat-welding polyimide resin layer 3, the heat-welding polyimide film is melted, whereby the internal electrodes 21 are brought into directly contact with the electrodes 11 of the semiconductor chip 1. The metal bumps 211 of the internal electrodes 21 are connected to the electrodes 11 of the semiconductor chip 1 by a collective press-connection such as a hot bar, a pulse heat, etc., or by an individual heat-press-connection by a single pint bonder to perform the electric connection of the semiconductor chip 1 and the auxiliary wiring plate 2. In addition, when the individual heat-press-connection by the single point binder is applied in the press-connection described above, it is preferred to lower the heat-press temperature by using ultrasonic bonding together. Solder bumps are used as the metal bumps 211 of the internal electrodes 21 and the connection of the metal bumps 211 and the electrodes 11 of the semiconductor chip 1 can be performed by a reflow soldering method. In this case, in the position adjustment of the electrodes 11 of the semiconductor chip 1 and the internal electrodes 21 of the auxiliary wiring plate 2, a discrepancy occurs a little, the discrepancy is corrected of itself by the surface tension of the molten soft solder, whereby the treatment for the alignment described below becomes unnecessary. Also, the electric connection may be simultaneously carried out at the formation of the heat-welding polyimide resin layer 3 described above.

In addition, in the case of forming a primer layer between the auxiliary wiring plate and the heat-welding polyimide resin layer [see, FIG. 1(A")], as the heat-welding polyimide film, the heat-welding polyimide film of a double structure having formed a primer layer may be used. That is, in the step of FIG. 3(H'), the semiconductor chip 1 is mounted on the auxiliary wiring plate 2 while interposing the heat-welding polyimide film of the double structure between them in the state that the primer layer faces the semiconductor chip 1-mounting surface of the auxiliary wiring plate 2. By performing the definite steps in the same manners as above, the heat-welding polyimide resin layer having the primer layer is formed in the gap between the semiconductor chip 1 and the auxiliary wiring plate 2.

Figure 3H:
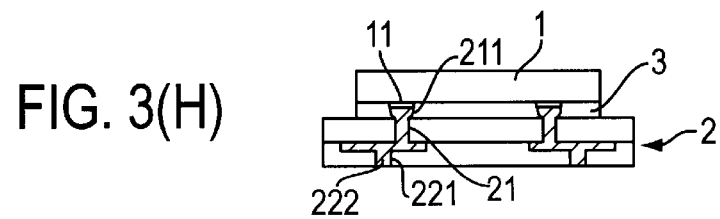
FIG. 3(H) is a configurational view showing the state that the gap between the semiconductor chip and the auxiliary wiring plate described above is encapsulated by forming a heat-welding polyimide resin layer.
Figure 4:
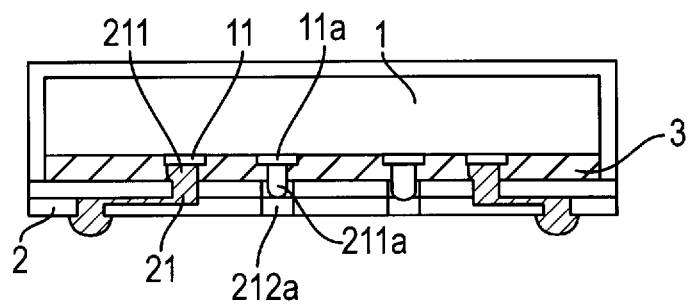
FIG. 4 is a configurational view shown an embodiment of an alignment.

In the step shown in FIG. 3(H), as a method of aligning the electrodes 11 of the semiconductor chip 1 and the metal bumps 211 of the internal electrodes 21 of the auxiliary wiring plate 2, as shown in FIG. 4, there is a method of forming dummy electrodes 11a to the semiconductor chip 1, fitting a bump 211a for alignment to each of the dummy electrodes, forming holes 212a for alignment in the auxiliary wiring plate 2, and inserting the bumps 211a for alignment in the holes 212a. In this case, it is necessary to form holes in the heat-welding polyimide film 3 at the positions corresponding to the bumps 211a for alignment. The height of the bump 211a for alignment is fairly higher than the metal bump 211 of the internal electrode 21. For example, when the height of the metal bump 211 is 20 μm, the height of the bump 211a for alignment is selected to be 50 μm. As the material of the bump 211a for alignment, when the bumps 211a are pressed at connecting the electrodes 11 of the semiconductor chip 1 to the metal bumps 211 of the auxiliary wiring plate 2, a material, which is softened at the connecting temperature, is used but when the bumps 211a are not pressed, there is no particular restriction on the material. In this case, it is preferred that the diameter of the holes 212a for alignment is selected such that the positional discrepancy of the electrode 11 of the semiconductor chip 1 and the metal bump 211 of the auxiliary wiring plate 2 is restrained below 10%.

Also, as the heat-welding polyimide film, a heat-welding polyimide film having a glass transition temperature of 300° C. or less, and preferably from 150° C. to 250° C., is preferably used. When at least one of the heat-welding polyimides represented by the formulae (1) to (5) described above is used, good results can be obtained.

The heat-welding polyimides represented by the formulae (1) to (5) described above are explained in detail below.

Each of these heat-welding polyimides can be produced by subjecting silicone-modified polyamic acid or unmodified polyamic acid, which is the precursor of the heat-welding polyimide, to an imide conversion by heating, etc. The silicone-modified polyamic acid or unmodified polyamic acid described above is prepared by reacting an acid anhydride, silicon-containing diamine, and silicon-free diamine shown below by conventional method.

Examples of the acid anhydride include 3,3',4,4'-biphenyltetracarboxylic acid dianhydride, 3,3',4,4'-benzophenonetetracarboxylic acid dianhydride, pyromellitic acid dianhydride, 2,2-bis(3,4-dicarboxyphenyl)propane dihydride, 2,2-bis(2,3-dicarboxyphenyl)hexafluoropropane dihydride, 2,2-bis(2,3-dicarboxyphenyl)propane dihydride, bis(3,4-dicarboxyphenyl)sulfone dihydride, bis(3,4-dicarboxyphenyl)etherdihydride, 1,1'-bis(2,3-dicarboxyphenyl)ethanedihydride, 2,3,6,7-naphthalenetetracarboxylic acid dihydride, 1,2,5,6-naphthalenecarboxyic acid dihydride, 1,4,5,8-naphthalenetetracarboxylic acid dihydride, 3,4,9,10-perylenetetracarboxylic acid dihydride, 2,3,6,8-anthracenetetracarboxylic acid dihydride, and 1,2,7,8-phenanthrenecarboxylic acid dihydride.

Examples of the silicon-containing diamine are the diaminosiloxanes represented by the following formula (15).

Specific examples thereof are bis(3-aminopropyl)tetramethyldisiloxane, bis(3-aminobutyl)tetramethyldisiloxane, α,ω-bis(3-aminopropyl)polydimethylsiloxane, and a dimethylsiloxane having a primary amine at both terminals.

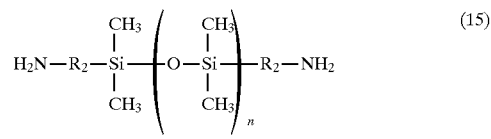
(15)

wherein $R_2$ represents $-CH_2CH_2CH_2-$, $-CH_2CH_2CH_2CH_2-$, or

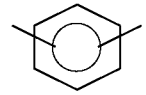

and n represents an integer of from 1 to 100.

Examples of the silicon-free diamine include 2,2-bis[4-(4-aminophenoxy)phenyl]propane, bis[4-(4-aminophenoxy)phenyl]ether, bis[4-(3-aminophenoxy)phenyl]ether, 2,2-bis[4-(4-aminophenoxy)phenyl]hexafluoropropane, bis[4-(4-aminophenoxy)phenyl]sulfone, bis[4-(3-aminophenoxy)phenyl]sulfone, 4,4'-bis(4-aminophenoxy)biphenyl, 4,4'-bis(3-aminophenoxy)biphenyl, 1,4-bis(4-aminophenoxy)benzene, 1,3-bis(4-aminophenoxy)benzene, 4,4'-diaminophenyl ether, 3,4'-diaminodiphenyl ether, 4,4'-diaminodiphenylsulfone, 3,3'-diamonodiphenylsulfone, 4,4'-diaminodiphenyl sulfide, 3,3'-diaminodiphenyl sulfide, 4,4'-diaminobenzanilide, p-phenylenediamine, and m-phenylenediamine. In these silicon-free diamines, 2,2-bis[4-(4-aminophenoxy)phenyl]propane, bis[4-(4-aminophenoxy)phenyl]ether, bis[4-(4-aminophenoxy)phenyl]propane, bis[4-(4-aminophenoxy)phenyl]ether, bis[4-(4-aminophenoxy)phenyl]sulfone, and 1,4-bis(4-aminophenoxy)benzene.

The preferred combinations of the acid anhydride, the silicon-containing diamine, and the silicon-free diamine described above are as follows.

(a) Combination of bis(3,4-dicarboxyphenyl)sulfone dihydride, bis(3-aminopropyl)tetramethyldisiloxane, and bis[4-(3-aminophenoxy)phenyl]sulfone.

(b) Combination of bis(3,4-dicarboxyphenyl)ether dihydride, bis(3-aminopropyl)tetramethyldisiloxane, and bis[4-(4-aminophenoxy)phenyl]ether.

(c) Combination of 2,2-bis(2,3-dicarboxyphenyl)propane dihydride, bis(3-aminopropyl)tetramethyldisiloxane, and 2,2-[4-(4-aminophenoxy)phenyl]propane.

(D) Combination of 2,2-bis(3,4-dicarboxyphenyl) hexafluoropropane dihydride, bis(3-aminopropyl) tetramethyldisiloxane, and 2,2-bis[4-(4-aminophenoxy)phenyl]hexafluoropropane.

The primer layer described above is preferably formed using at least one of the polyimides represented by the following formulae (6) to (8).

$0.3 \leq c/(c+d) \leq 1.00$; the polyimide represented by the formula (6) to (8) may be a random copolymer or a block copolymer.

The aromatic silicon-free diamine residue represented by $R_3$ above generally has a molecular weight of from about 100 to 1,000. Preferably, the residue represented by $R_4$ is used as the aromatic silicon-free diamine residue, $R_3$.

The aromatic tetracarboxylic acid residue represented by Ar above has a molecular weight of from about 50 to 1,000, and preferably from 100 to 500.

n is an integer of from 1 to 100 as described above, but since a compound of the formula (15) described after is

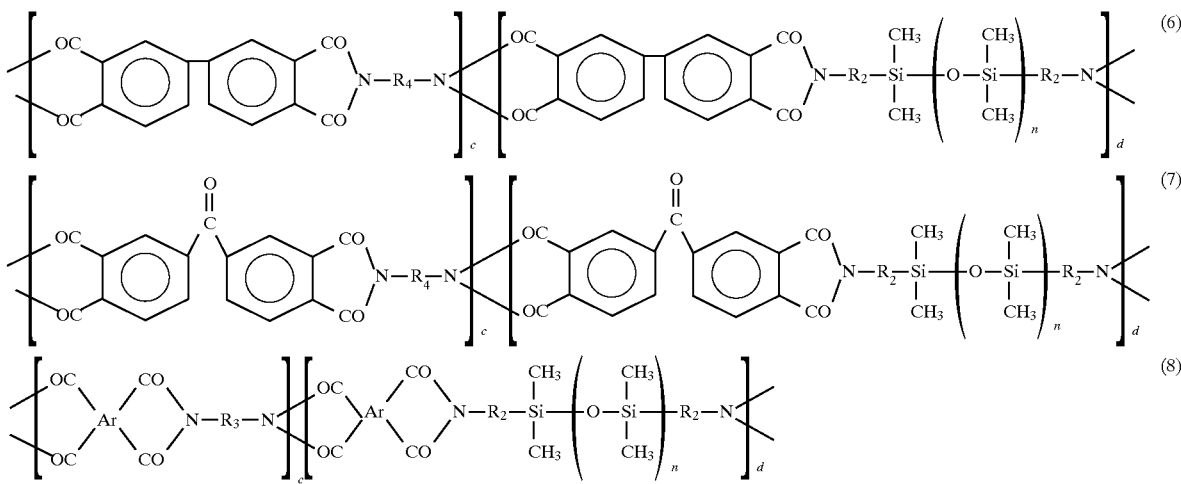

[In the above formulae (6) to (8), $R_4$ represents

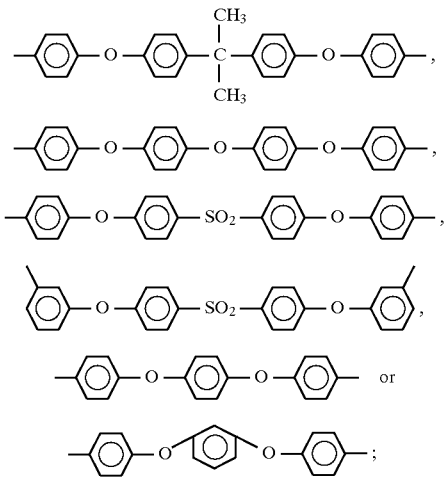

$R_2$ represents —$C_3H_6$—, —$C_4H_8$—, or

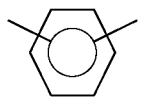

; $R_3$ represents an aromatic silicon-free diamine residue; Ar represents an aromatic tetracarboxylic acid residue; n represents an integer of from 1 to 100; and c and d are numbers satisfying the relationship of c+d=1 and the relationship of generally used in the form of a mixture of compounds having different n, n on the average is preferably from 2 to 10.

The relationship between c and d is generally the relationship described above, and c and d are preferably numbers satisfying the relationship of $0.5 \leq c/(c+d) \leq 0.9$.

Each of these polyimides can be produced by subjecting silicone-modified polyamic acid or unmodified polyamic acid, which is the precursor of the heat-welding polyimide, to an imide conversion by heating, etc. The silicone-modified polyamic acid or unmodified polyamic acid described above is prepared by reacting an acid anhydride, silicon-containing diamine, and silicon-free diamine shown below by conventional method.

Examples of the acid anhydride include 3,3',4,4'-biphenyltetracarboxylic acid dianhydride, 3,3',4,4'-benzophenonetetracarboxylic acid dianhydride, pyromellitic acid dianhydride, 2,2-bis(3,4-dicarboxyphenyl)propane dihydride, 2,2-bis(2,3-dicarboxyphenyl)hexafluoropropane dihydride, 2,2-bis(2,3-dicarboxyphenyl)propane dihydride, bis(3,4-dicarboxyphenyl)sulfone dihydride, bis(3,4-dicarboxyphenyl)ether dihydride, 1,1'-bis(2,3-dicarboxyphenyl)ethane dihydride, 2,3,6,7-naphthalenetetracarboxylic acid dihydride, 1,2,5,6-naphthalenecarboxyic acid dihydride, 1,4,5,8-naphthalenetetracarboxylic acid dihydride, 3,4,9,10-perylenetetracarboxylic acid dihydride, 2,3,6,8-anthracenetetracarboxylic acid dihydride, and 1,2,7,8-phenanthrenecarboxylic acid dihydride.

Examples of the silicon-containing diamine are the diaminosiloxanes represented by the following formula (15).

Specific examples thereof include bis(3-aminopropyl) tetramethyldisiloxane, bis(3-aminobutyl)

tetramethyldisiloxane, α,ω-bis(3-aminopropyl) polydimethylsiloxane, and a dimethylsiloxane having a primary amine at both the terminals.

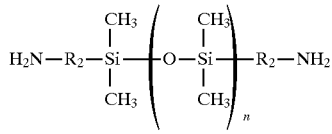 (15)

wherein $R_2$ represents $-CH_2CH_2CH_2-$, $-CH_2CH_2CH_2CH_2-$, or

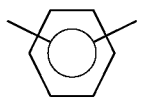

and n represents an integer of from 1 to 100.

The diamine of the formula (15) above is used in the form of a mixture of diamines each having different n. Preferably, n is an integer of from 1 to 100, and n on the average is from 2 to 10.

Examples of the silicon-free diamine include 2,2-bis[4-(4-aminophenoxy)phenyl]propane, bis[4-(4-aminophenoxy)phenyl]ether, bis[4-(3-aminophenoxy)phenyl]ether, 2,2-bis[4-(4-aminophenoxy)phenyl]hexafluoropropane, bis[4-(4-aminophenoxy)phenyl]sulfone, bis[4-(3-aminophenoxy)phenyl]sulfone, 4,4'-bis(4-aminophenoxy)biphenyl, 4,4'-bis(3-aminophenoxy)biphenyl, 1,4-bis(4-aminophenoxy)benzene, 1,3-bis(4-aminophenoxy)benzene, 4,4'-diaminophenyl ether, 3,4'-diaminodiphenyl ether, 4,4'-diaminodiphenylsulfone, 3,3'-diamonodiphenylsulfone, 4,4'-diaminodiphenyl sulfide, 3,3'-diaminodiphenyl sulfide, 4,4'-diaminobenzanilide, p-phenylenediamine, and m-phenylenediamine. In these silicon-free diamines, 2,2-bis[4-(4-aminophenoxy)phenyl]propane, bis[4-(4-aminophenoxy)phenyl]ether, bis[4-(4-aminophenoxy)phenyl]propane, bis[4-(4-aminophenoxy)phenyl]ether, bis[4-(4-aminophenoxy)phenyl]sulfone, and 1,4-bis(4-aminophenoxy)benzene.

The preferred combinations of these three components are as follows.

(e) Combination of 3,3',4,4'-biphenyltetracarboxylic acid dihydride, bis(3-aminopropyl)tetramethyldisiloxane, and 4,4'-bis(4-aminophenoxy)biphenyl.

(f) Combination of 3,3',4,4'-benzophenonetetracarboxylic acid dihydride, bis(3-aminopropyl)tetramethyldisiloxane, and 1,4-bis(4-aminophenoxy)benzene.

The preferred combination of the material for forming the heat-welding polyimide layer described above and the material for forming the primer layer described above is the combination of the heat-welding polyimide represented by the formula (1) described above and the polyimide represented by the formula (6) described above.

Figure 3I:
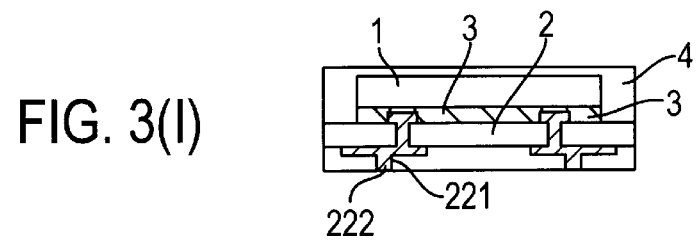
FIG. 3(I) is a configurational view showing the state that the semiconductor chip is encapsulated with a resin.

The semiconductor chip 1 is mounted on the auxiliary wiring plate 2 and after encapsulating the gap between both the members with the heat-welding polyimide resin layer 3, as shown in FIG. 3(I), if necessary, the entire surface of the semiconductor chip 1 excluding the circuit-formed surface (the surface of the electrode 11 side) may be encapsulated with a resin 4. For resin encapsulation, conventional method such as a transfer molding method, a potting method, a casting method, a seed lamination, etc., can be applied. In addition, the application of resin encapsulation of the semiconductor chip excluding the circuit-formed surface (the surface of the electrode side) is unnecessary if there is no particular inconvenience in the mounting property, the reliability, etc. The semiconductor device wherein only the gap between the semiconductor chip and the auxiliary wiring plate is encapsulated has an advantage that the heat radiating property is improved as described below.

After resin encapsulation as described above, by forming solder bumps (not shown) of the external electrodes 22 in the same manner as forming the metal bumps 211 of the internal electrodes, the production of a semiconductor device is finished.

The semiconductor device can be packaged with a circuit substrate by, for example, a reflow soldering method and in this case, since the external electrodes each comprises a solder bump, even when the position adjustment of the external electrodes of the semiconductor device and the conduct terminals of the circuit substrate for packaging has a discrepancy a little, the positions are corrected by itself by the surface tension of the molten soft solder.

In the production method of the semiconductor device described above, the production steps are not limited to the above steps in the present invention. For example, after forming the covercoat insulating layer 25 and before the formation of the external electrodes, the semiconductor chip 1 is connected, the gap between the semiconductor chip 1 and the auxiliary wiring plate 2 is resin-encapsulated, and the external electrodes are then formed to the covercoat insulating layer 25.

In the present invention, the mode of resin-encapsulating the semiconductor device is not limited to the embodiment shown in FIG. 1 and, for example, there are other embodiments shown in FIGS. 5(A) to (E). In addition, in FIG. 5, the same portions as FIG. 1 are shown by the same numerals as FIG. 1.

Figure 5A:
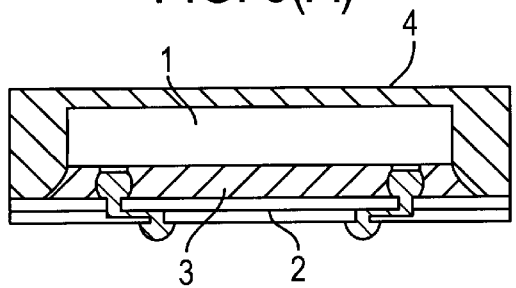
FIG. 5(A) is a configurational view showing an embodiment of resin encapsulation of the semiconductor device of the present invention.
Figure 5B:
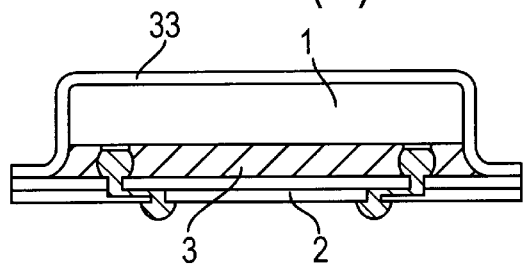
FIG. 5(B) is a configurational view showing other embodiment of resin encapsulation of the semiconductor device of the present invention.
Figure 5C:
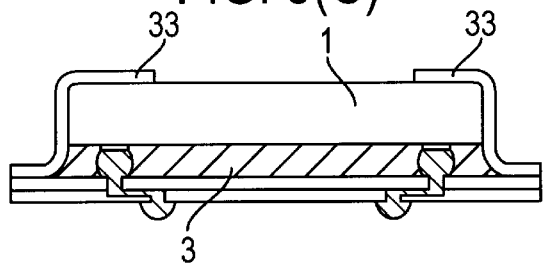
FIG. 5(C) is a configurational view showing still other embodiment of resin encapsulation of the semiconductor device of the present invention.

First, in the semiconductor device shown in FIG. 5(A), the gap of a semiconductor chip 1 and an auxiliary wiring plate 2 is encapsulated with a heat-welding polyimide resin layer 3, and the side edge portions of the semiconductor chip 1 and the surface (the upper surface in the figure) of the semiconductor chip 1 opposite the circuit-formed surface are encapsulated with a silicone resin 4. In the semiconductor device shown in FIG. 5(B), the gap between the semiconductor chip 1 and the auxiliary wiring plate 2 is encapsulated with a heat-welding polyimide resin layer 3, and the side edge portions of the semiconductor chip 1 and the surface of the semiconductor chip opposite the circuit-formed surface are encapsulated by adhering an adhesive sheet 33 (for example, an adhesive sheet using an epoxy-rubber-series resin as an adhesive). In the semiconductor device shown in FIG. 5(C), a part of the surface (the upper surface) of the semiconductor chip 1 opposite the circuit-formed surface in the semiconductor device shown in FIG. 5(B) is exposed. By exposing a part of the surface of the semiconductor chip 1 opposite the circuit-formed surface as shown in FIG. 5(C), the heat radiation is improved.

Figure 5D:
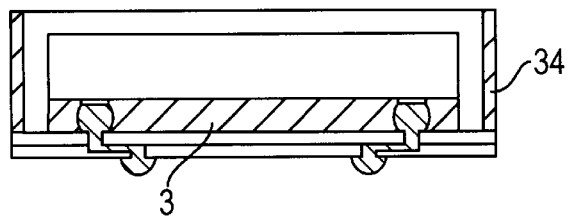
FIG. 5(D) is a constitutional view showing other embodiment of resin encapsulation of the semiconductor device of the present invention.
Figure 5E:
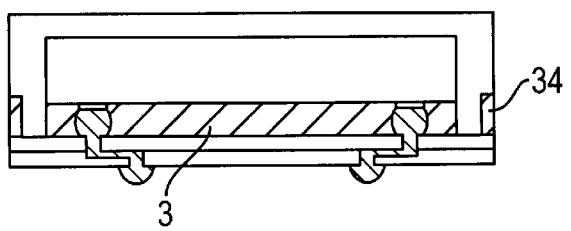
FIG. 5(E) is a configurational view showing another embodiment of resin encapsulation of a semiconductor device of the present invention.

In the semiconductor devices shown in FIG. 5(D) and FIG. 5(E), a reinforcing frame 34 (made of a synthetic resin or made of a metal) is fixed.

As a semiconductor device having other resin-encapsulated mode, there are semiconductor devices shown in FIG. 6(A) to (D). In these semiconductor devices, for improving the heat radiating property of each semiconductor chip 1, the surface of the semiconductor chip 1 opposite the circuit-formed surface is exposed or a heat radiating fin is used. In addition, in FIG. 6, the same portions as FIG. 1 are shown by the same numerals as FIG. 1.

Figure 6A:
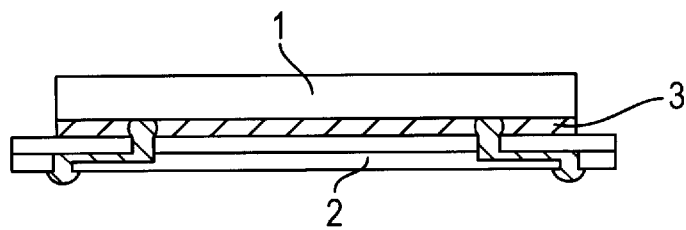
FIG. 6(A) is a configurational view showing an embodiment of heat-radiating means for the semiconductor device of the present invention.
Figure 6B:
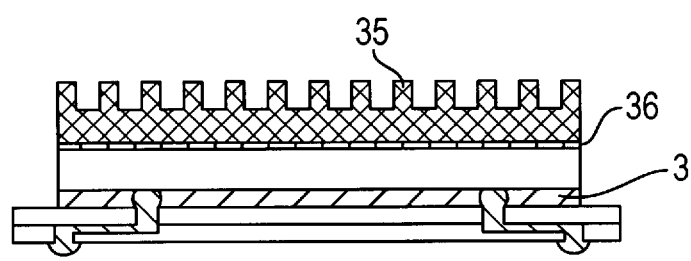
FIG. 6(B) is a configurational view showing other embodiment of a heat-radiating means forth semiconductor device of the present invention.
Figure 6C:
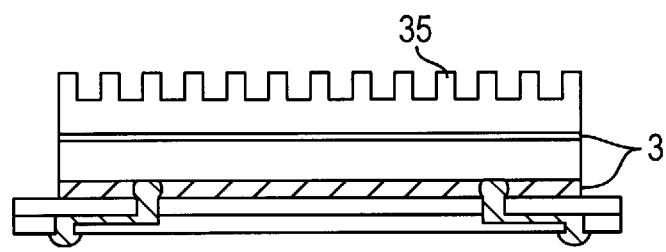
FIG. 6(C) is a configurational view showing still other embodiment of a heat-radiating means for the semiconductor device of the present invention.

First, in the semiconductor device shown in FIG. 6(A), the surface of the semiconductor chip 1 opposite the circuit-formed surface is completely exposed and in the semiconductor device shown in FIG. 6(B), a heat radiating fin 35 is equipped to the surface of the semiconductor chip 1 opposite the circuit-formed surface thereof with a heat-conductive adhesive 36. In the semiconductor device shown in FIG. 6(C), a heat spreader 35 is equipped to the surface of the semiconductor device 1 opposite the circuit-formed surface with an encapsulating resin 3. In the semiconductor device shown in FIG. 6(D), internal metal-filled holes 371, which are not in contact with the electrodes 11 of the semiconductor chip 1, an internal conductor 372 (different from a leading conductor 23) thermally connected to the internal conductors 372, and external metal-filled holes 373 and metal bumps 374, which are thermally connected to the internal conductor 372, are formed, and the generated heat of the semiconductor chip 1 is radiated through the heat-transmitting route formed by them.

Figure 6D:
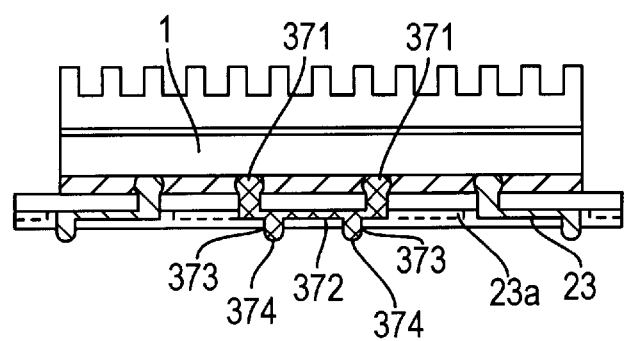
FIG. 6(D) is a configurational view showing another embodiment of a heat-radiating means for the semiconductor device of the present invention.

In the semiconductor device shown in FIG. 6(D), it is effective as a heat-radiating means that as shown by the dotted lines, conductors (copper foil) 23a are left as many as possible with a definite interval from the leading conductor 23 and the remaining conductors 23a are used as a heat spreader and also a heat-radiating dummy is formed.

The second embodiment of the production method of semiconductor device of the present invention is explained.

Figure 11:
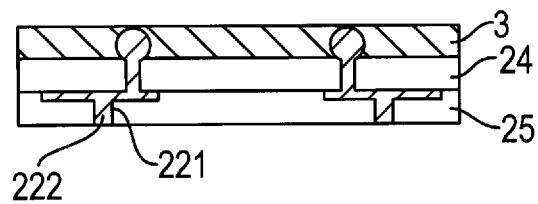
FIG. 11 is a configurational view showing an embodiment of an auxiliary wiring plate having formed thereon a heat-welding polyimide resin layer.
Figure 12:
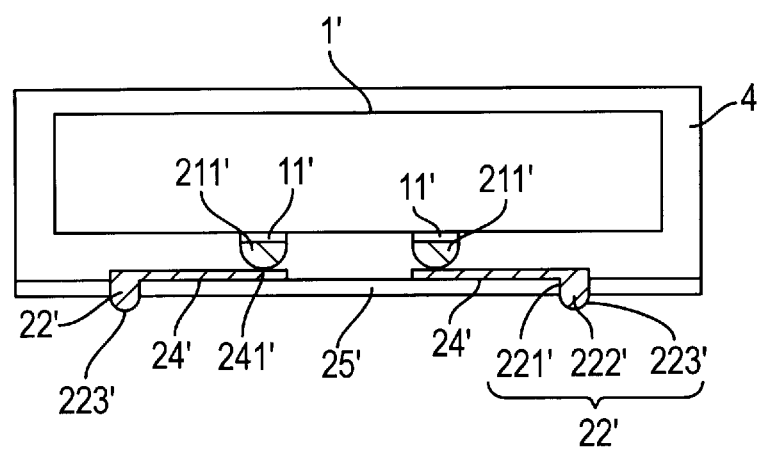
FIG. 12 is a configurational view showing the structure of an embodiment of a conventional semiconductor device.

The production method is a method of using an auxiliary wiring plate having formed a heat-welding polyimide resin layer on the semiconductor chip-mounting surface. An embodiment of the auxiliary wiring plate is shown in FIG. 11. As shown in FIG. 11, a heat-welding polyimide resin layer 3 is formed on an insulating layer 24. In addition, in the figures, the same portions as FIG. 3 are shown by the same numerals as FIG. 3. The auxiliary wiring plate can be obtained by preparing an auxiliary wiring plate of the type used in the embodiment of the first production method of the present invention through the steps shown in FIG. 3(A) to (G) and forming a heat-welding polyimide resin layer 3 on the auxiliary wiring plate (on the insulating layer 24). The heat-welding polyimide resin layer can be formed by preparing an auxiliary wiring plate [see, FIGS. 3(A) to (G)] and laminating a heat-welding polyimide film on the plate, or coating a heat-welding polyimide varnish on the plate and removing a solvent by heating.

In the case of forming a primer layer, for example, the polyimide shown by the formulae (6) to (8) described above is dissolved in a solvent to prepare a varnish, the varnish is coated on an auxiliary wiring plate [see, FIG. 3(G)] followed by drying to form a primer layer, and the heat-welding polyimide resin layer is formed thereon by the above method, whereby the auxiliary wiring plate having the primer layer and the heat-welding polyimide resin layer is obtained.

There is also a method of laminating a polyimide film for forming a primer layer on an auxiliary wiring plate [see FIG. 3(G)] to form a primer layer and then forming thereon the heat-welding polyimide resin layer.

A semiconductor chip 1 is mounted on the heat-welding polyimide resin layer 3 of the auxiliary wiring layer shown in FIG. 11, and by following the same steps as the first production method described above, the semiconductor device can be produced. Accordingly, in the second production method of the present invention, the formation method of the polyimide resin layer is different from the first production method of the present invention and in other steps, the procedures and the conditions are the same as those in the first production method and also the materials for forming the heat-welding polyimide resin layer, etc., are the same as those in the latter method.

As described above, the feature of the second production method of the present invention is to use the auxiliary wiring plate having formed the heat-welding polyimide resin layer on the semiconductor chip-mounting surface thereof, and by using the auxiliary wiring plates, the effect that the continuous production of semiconductor devices becomes possible, etc., can be obtained.

As the auxiliary wiring plate having formed a heat-wiring polyimide resin layer on the semiconductor chip-mounting surface thereof, there is tape carriers for semiconductor device developed by the inventors.

The tape carriers for semiconductor device are generally classified into a tape carrier wherein the internal electrodes are covered by a heat-welding polyimide film (type A) and a tape carrier wherein the internal electrodes are exposed without being covered by a film (type B). The common feature to these tape carriers for semiconductor device is that they have a heat-welding polyimide film formed using at least one of the heat-welding polyimides represented by the formulae (1) to (5) described above. As described before, the specific silicone-modified polyimide has a very high adhesive force to both the semiconductor chip and the auxiliary wiring plate (high-molecular weight film) and also is excellent in the heat-welding property and the chemical resistance. In addition, the thickness of the heat-welding polyimide film is usually from 5 $\mu$m to 80 $\mu$m, and preferably from 10 $\mu$m to 40 $\mu$m.

First, the tape carrier for semiconductor device of the type A described above is explained.

Figure 7:
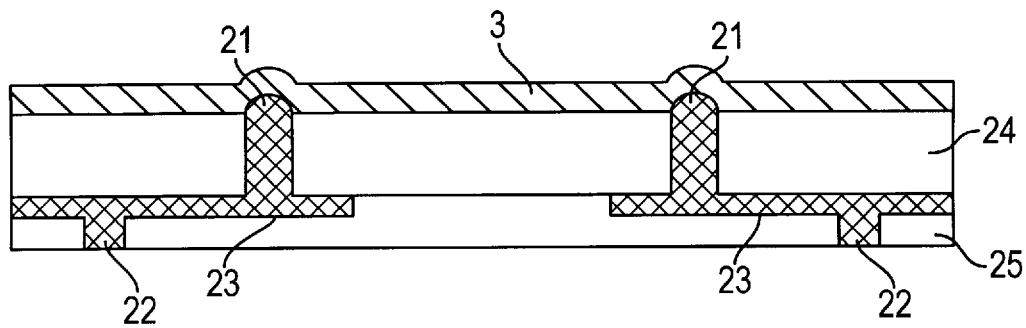
FIG. 7 is a configurational view showing an embodiment of the tape carrier for semiconductor device of the present invention.

FIG. 7 shows an embodiment of the tape carrier for semiconductor device of the type A described above. As shown in FIG. 7, the tape carrier for semiconductor device has the same construction as the auxiliary wiring plate described above excluding the heat-welding polyimide film 3. That is, a insulating layers 24 and 25 are laminated to form a high molecular weight film of a double layer structure and leading conductors 23 are disposed at definite portions of the interface between the insulating layers 24 and 25. As the insulating layers 24 and 25, it is preferred from the view point of the heat resistance to use a polyimide film. One end of the leading conductor 23 is connected to each internal electrode 21 and the other end of the leading conductor 23 is connected to each external electrode 22. The surface of the high-molecular weight film comprising the insulating layers 24 and 25 at the semiconductor chip-mounting side is covered by a specific heat-welding polyimide film. The heat-welding polyimide film is formed with at least one of the heat-welding polyimides represented by the formulae (1) to (5) described above. The heat-welding polyimide film covers the internal electrodes 21.

The tape carrier for semiconductor of the type A can be prepared by disposing leading conductors in the inside of the high-molecular film, forming internal electrodes (metal bumps), and covering the surface of the high-molecular weight film with the heat-welding polyimide film.

Figure 9A:
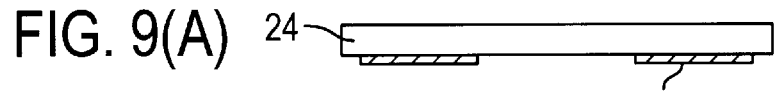
FIG. 9(A) is a configurational view showing the state that leading conductors are formed under a support insulating film.
Figure 9B:
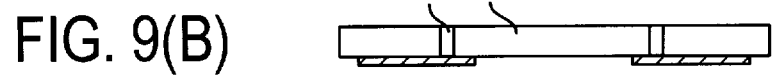
FIG. 9(B) is a configurational view showing the state that holes are formed in the support insulating films.
Figure 9C:
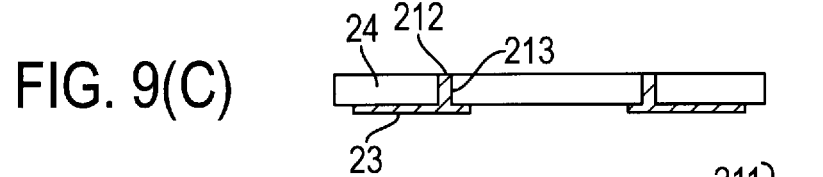
FIG. 9(C) is a configurational view showing the state that a metal is filled in the holes.
Figure 9D:
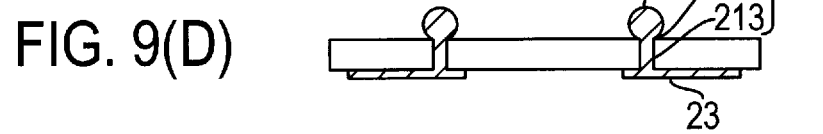
FIG. 9(D) is a configurational view showing the state that a metal bump is formed on the end surface of each filled metal described above.
Figure 9E:
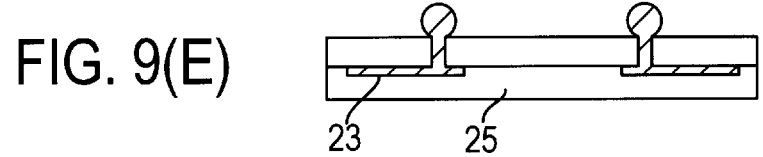
FIG. 9(E) is a configurational view showing the state that a cover coat insulating layer laminated on the support insulating film.
Figure 9F:
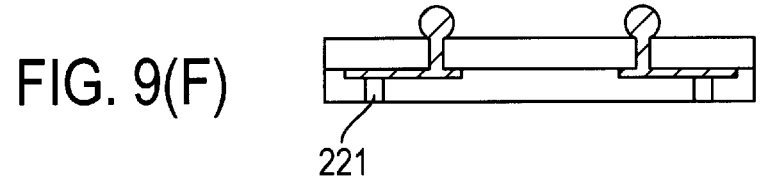
FIG. 9(F) is a configurational view showing the state that holes are formed in the cover coat insulating layer.
Figure 9G:
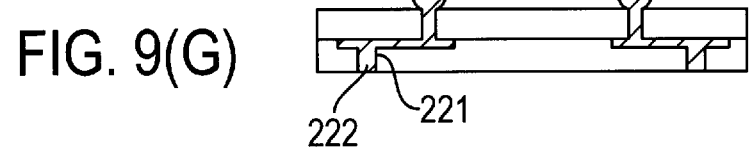
FIG. 9(G) is a configurational view showing the state that a metal is filled in the holes of the cover coat insulating layer.
Figure 9H:
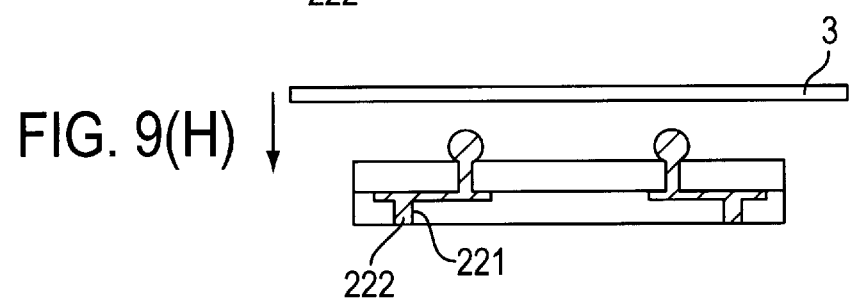
FIG. 9(H) is a configurational view showing the state that a heat-welding polyimide film is adhered to the support insulating film (high-molecular weight film)

That is, as shown in FIG. 9(A) to (G), a high-molecular weight film 2 having internal electrodes 21, external electrodes 22, and leading conductors 23 is prepared. The high-molecular weight film can be prepared in the same manner as the production of the auxiliary wiring plate described above. Accordingly, the formation conditions and the materials used, etc., are the same as the case of producing the auxiliary wiring plate. In FIG. 9, the same portions as FIG. 3 are indicated by the same numerals. As shown in FIG. 9(H), the surface of the high-molecular weight film is covered with the heat-welding polyimide film 3 by, for example, a heat laminating method. As other method, the heat-welding polyimide film 3 can be formed by dissolving the heat-welding polyimide in a solvent and coating the solution on the surface of the high-molecular weight film followed by drying. Thus, the tape carrier for semiconductor device of the type A shown in FIG. 7 can be prepared.

That is, since according to the method, after the formation of the internal electrodes (metal bumps), the surface of the high-molecular weight film is covered with the heat-welding polyimide film, the internal electrodes are also covered with the same film.

Figure 8A:
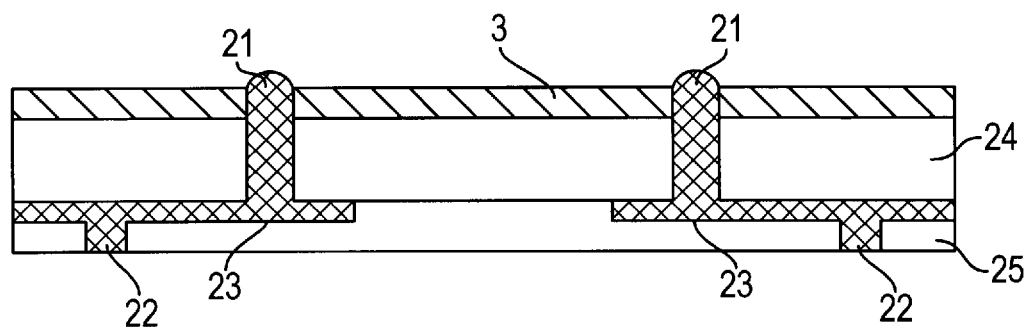
FIG. 8(A) is a configuration view showing an embodiment of the tape carrier for semiconductor device of the present invention.

An embodiment of the tape carrier for semiconductor device of the type B is shown in FIG. 8. The tape carrier for semiconductor device shown in FIG. 8(A) has the same construction as the tape carrier for semiconductor device of the type A except that the internal electrodes 21 are exposed. As the case of the tape carrier of the type A described above, it is preferred from the view point of the heat resistance that the polyimide film is used for the insulating layers 24 and 25.

The tape carrier for semiconductor device of the type B can be prepared, for example, as follows.

First, a high-molecular weight film having disposed in the inside thereof leading conductors is prepared and the heat-welding polyimide film is formed on the surface thereof by the laminating method or a coating method. Internal electrodes are formed in the high-molecular weight film including the heat-welding polyimide film by the steps of the formation of holes, metal filling, the formation of metal bumps, etc., (see FIG. 3). Thus, the tape carrier for semiconductor device of the type B having internal electrodes projecting from the heat-welding polyimide film can be prepared.

As other production method of the tape carrier for semiconductor device of the type B, there is a method of preparing the tape carrier for semiconductor device of the type A described above. The portions of the heat-welding polyimide film corresponding to the internal electrodes 21 are partially melt-removed by heating, etc., to expose the internal electrodes.

Figure 8B:
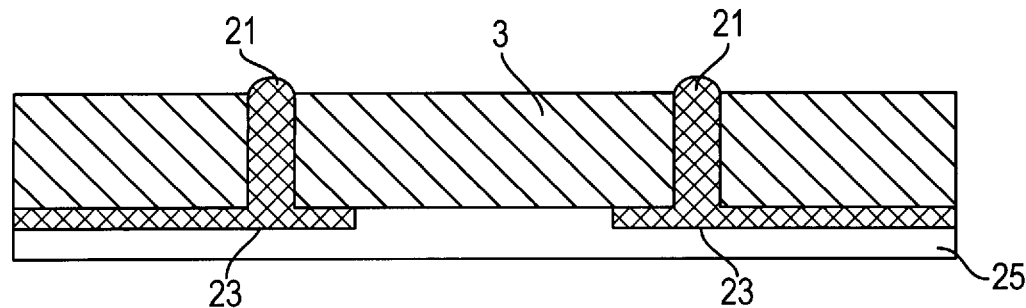
FIG. 8(B) is a configurational view showing another embodiment of the tape carrier for semiconductor device of the present invention.

In the tape carrier for semiconductor device shown in FIG. 8(B), the high-molecular weight film has a monolayer structure composed of an insulating layer 25 only. In addition, in FIG. 8(B), external electrodes are omitted and the same portions as FIG. 8(A) are indicated by the same numerals as FIG. 8(A). From the view point of the heat resistance, it is preferred that a polyimide film is used as the insulating layer 25.

In the tape carriers for semiconductor device of the type A and the type B, it is preferred that a primer layer exists between the high-molecular weight film and the heat-welding polyimide film. The method of forming the primer layer is the same as the method described above. That is, before forming the heat-welding polyimide film, the primer layer is formed by the coating method or the laminating method described above. When after forming the internal electrodes (metal bumps), the primer layer and the heat-welding polyimide film are formed, the tape carrier for semiconductor device of the type A is obtained, while when after forming the primer layer and the heat-welding polyimide layer, the internal electrodes (metal bumps) are formed, the tape carrier for semiconductor device of the type B is obtained.

As described above, the tape carrier for semiconductor device of the present invention includes the tape carrier for semiconductor device (type A) wherein the internal electrodes are covered and the tape carrier for semiconductor device (type B) wherein the internal electrodes are exposed. In these tape carriers, the selection of the type is properly determined by the kind of the semiconductor chip which is mounted thereto, the condition for the heat-press-adhering treatment, etc. In addition, the tape carrier for semiconductor device of the type A has the advantage of excellent in the storage managing property, etc., since the internal electrodes are protected with the heat-welding polyimide film. On the other hand, the tape carrier for semiconductor device of the type B has the advantage that in the production of a semiconductor device, after mounting a semiconductor chip on the tape carrier, the heat-press-contacting step of the semiconductor chip and the tape carrier semiconductor can be carried out under a mild condition since the internal electrodes are in the state of being exposed.

The production of semiconductor devices using these tape carrier for semiconductor device is fundamentally the same as the production method described above. That is, a semiconductor chip is mounted on the heat-welding polyimide film of the tape carrier, and the tape carrier and the semiconductor chip are press-contacted with each other under heating to melt the heat-welding polyimide film and weld the film to both the members. By curing the heat-welding polyimide film by cooling, etc., the heat-welding polyimide resin layer is formed to encapsulate the gap between the semiconductor chip and the tape carrier. By carrying out the definite steps described above, the electrodes of the semiconductor chip are connected to the internal electrodes of the tape carrier, solder bumps of the external electrodes are formed, and, if necessary, the semiconductor chip is encapsulated with a resin, whereby a semiconductor device can be produced. The means and the conditions of the alignment, etc., at mounting the semiconductor chip are the same as described above.

Other advantage of using the tape carrier for semiconductor device is that the continuous production of semiconductor devices can easily be practiced. That is, a belt-like tape carrier for semiconductor device, wherein internal electrodes, external electrodes, leading conductors, and the heat-welding polyimide film are formed per each semiconductor chip, is prepared and while travelling the tape carrier in the longitudinal direction, by successively continuing the mounting work of semiconductor chips, etc., by a film-carrier system, semiconductor devices can be continuously produced.

In the tape carrier for semiconductor device of the present invention, the area of the surface thereof is the same as the bottom area of the semiconductor chip 1 (the area of the circuit-formed surface, usually (3 to 20) mm×(3 to 20) mm) or is more less than 200% of the surface area, and more preferably less than 130% of the surface area.

In the tape carrier for semiconductor device of the present invention, the interval between the external electrodes is as wide as possible for preventing the occurrence of bridge at soldering the tape carrier to a circuit substrate for packaging. The intervals of the external electrodes are usually the same interval for each pair of the external electrodes.

In the tape carrier for semiconductor device of the present invention, it is preferred that an insulating layer is formed on the back surface of the high-molecular weight film excluding the exposed surfaces of the external electrodes, and it is particularly preferred that the insulating layer is an insulating layer formed by a polyimide. The formation of the insulating layer is for preventing the corrosion of the leading conductors of the auxiliary wiring plate and for preventing the occurrence of defect of the electric contact to other circuits (short-circuiting).

As described above, in the semiconductor device of the present invention, the semiconductor chip is mounted on the auxiliary wiring plate and at least the gap between the auxiliary wiring plate and the semiconductor chip is encapsulated by the formation of the heat-welding polyimide resin layer. The heat-welding polyimide resin layer has a high adhesive property to the semiconductor chip and the auxiliary wiring plate. Thus, in the semiconductor device of the present invention, even when a heat treatment such as soldering packaging, etc., is carried out, the occurrence of gaps between the semiconductor chip and the heat-welding polyimide resin layer, between the auxiliary wiring plate and the heat-welding polyimide resin layer, etc., are restrained and thus the occurrence of cracks of the encapsulating resin accompanied the occurrence of the gaps is prevented. As a result, the reliability of the semiconductor device is improved. Accordingly, when the present invention is applied to, for example, a semiconductor device of the CSP type, the semiconductor device of the CSP type which can carry out high-density mounting and is very excellent in the reliability can be obtained. Such a semiconductor device can be efficiently produced by the production method of semiconductor device of the present invention, and can be particularly preferably produced by using the tape carrier for semiconductor device of the present invention.

The tape carrier for semiconductor device becomes the auxiliary wiring plate and previously has the specific heat-welding polyimide film. Accordingly, by using tape carrier for semiconductor device of the present invention, semiconductor devices wherein the gap between the semiconductor chip and the auxiliary wiring plate is encapsulated by the formation of the heat-welding polyimide resin layer can be continuously produced by a tape carrier system and the reduction of the production cost of semiconductor devices is expected.

In the present invention, it is also preferred that as the heat-welding polyimide, at least one of the polyimides represented by the formulae (1) to (5) described above is used. That is, these polyimides have a very high adhesive force to the semiconductor chips and the auxiliary wiring plates and also are excellent in the heat-welding property and the chemical resistance. Accordingly, in the semiconductor device obtained by the application of the polyimide, since the adhesive force is very high, the occurrence of the defect of electroconductivity is more lowery restrained and also since the polyamide is excellent in the heat-welding property, the production efficiency of the semiconductor devices is improved. Also, since the polyimide is excellent in the chemical resistance, the chemical resistance of the tape carrier for semiconductor device used for the production of semiconductor devices is improved.

Moreover, in the present invention, when the heat-welding polyimide resin layer is adhered to the auxiliary wiring plate via the primer layer, by the action of the primer layer, both members are strongly adhered to each other. As a result, in the semiconductor device obtained, the occurrence of the defect of electroconductivity becomes more reduced and thus, the reliability of the semiconductor device can be more improved.

The present invention is explained in more detail by reference to the examples and the comparative examples.

First, prior to the description of the examples and the comparative examples, the silicone-modified polyimides represented by the following formulae (9) to (14) were prepared.

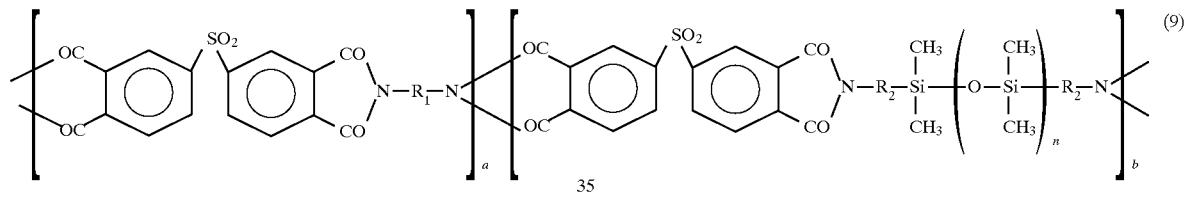

wherein $R_1$ represents

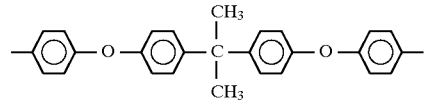

; $R_2$ represents —$C_3H_6$—; a represents 0.62; b represents 0,38; and n represents 9.

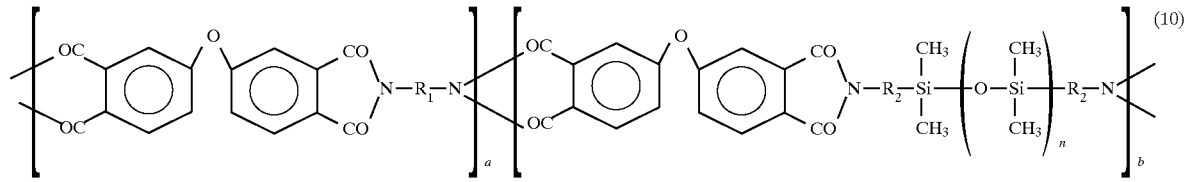

wherein $R_1$ represents

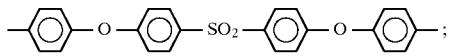

$R_2$ represents —$C_3H_6$—; a represents 0.62; b represents 0.38; and n represents 9.

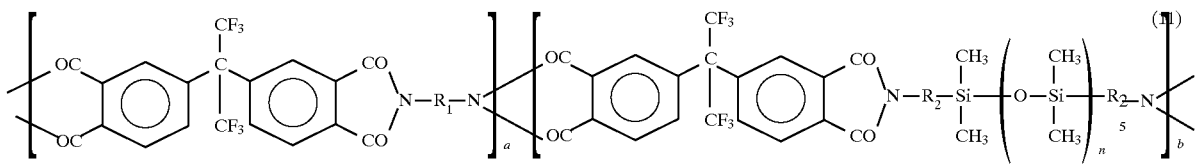

wherein $R_1$ represents

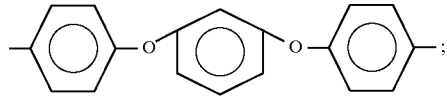

$R_2$ represents —$C_3H_6$—; a represents 0.62; b represents 0.38; and n represents 9.

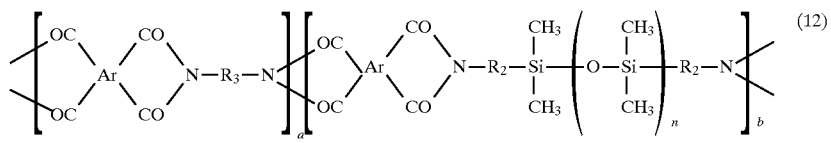

wherein Ar represents

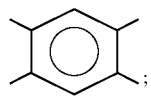

$R_2$ represents —$C_3H_6$—; $R_3$ represents

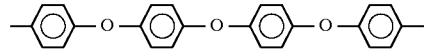

represents 0.62; b represents 0.38; and n represents 9.

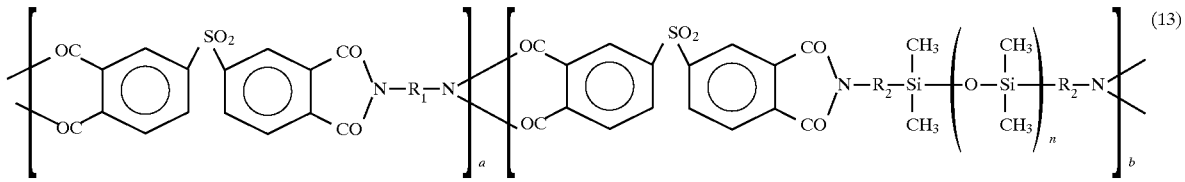

wherein $R_1$ represents

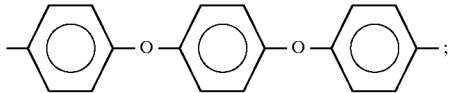

$R_2$ represents —$C_3H_6$—; a represents 0.85; b represents 0.15; and n represents 9.

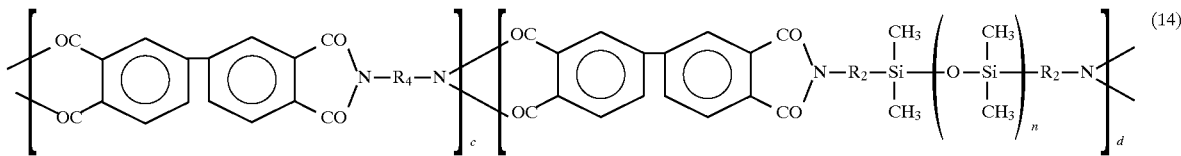

wherein $R_4$ represents

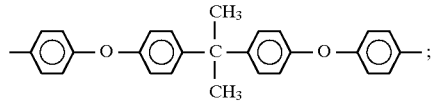

$R_2$ represents —$C_3H_6$—; c represents 0.965; d represents 0.035; and n represents 1.

EXAMPLE A (1 TO 15)

Each of semiconductor devices was prepared using each of the support films and the heat-welding polyimide films shown in Tables 1 to 3 below by the method (the first production method described above) of mounting a semiconductor chip on the surface of an auxiliary wiring plate via the heat-welding polyimide film. That is, internal electrodes having metal bumps of 50 μm in height were formed to a support of 50 μm in thickness having the same area as the bottom surface of the semiconductor chip. The heat-welding polyimide film of 25 μm in thickness was disposed on the surface (the surface of the internal electrode side) of the auxiliary wiring plate, the semiconductor chip [15.0 mm×15.0 mm×0.375 mm(thick)] for reliability evaluation was mounted on the film, the auxiliary wiring plate and the semiconductor chip were press-contacted each other under the condition of 350° C. to form a heat-welding polyimide resin layer. Thereafter, the connection of electrodes each other and resin-encapsulation of the semiconductor chip were carried out to obtain the semiconductor device of the CSP type. The size of the semiconductor device was 17.0 mm×17.0 mm×0.55 mm(thick).

In Tables 1 to 3 below, PI shows a polyimide film, PET shows a polyethylene terephthalate film, and PP shows a polypropylene film.

The alkali treatment was carried out by immersing the support film in an aqueous solution of 0.1N potassium hydroxide for 5 hours and the plasma treatment was carried out by applying a glow discharging treatment to the support film under the conditions of 100 W, 13.56 mHz, and 30 seconds in an oxygen gas atmosphere of 0.1 torr. The measurement of the surface tension was carried out by a contact angle method using the Fowkes's equation.

TABLE 1

| | Example A | | | | |
|---|---|---|---|---|---|
| | 1 | 2 | 3 | 4 | 5 |
| Support Film (kind) | PI | PET | Alkali-treated PET | Plasma-treated PP | Plasma-treated PI |
| Surface Tension γ (mJ/m$^2$) | 47 | 42 | 53 | 59 | 65 |
| Heat-welding Polyimide (Formula) | (9) | (9) | (9) | (9) | (9) |

TABLE 2

| | Example A | | | | |
|---|---|---|---|---|---|
| | 6 | 7 | 8 | 9 | 10 |
| Support Film (kind) | PI | PET | Alkali-treated PET | Plasma-treated PP | Plasma-treated PI |
| Surface Tension γ (mJ/m$^2$) | 47 | 42 | 53 | 59 | 65 |
| Heat-welding Polyimide (Formula) | (10) | (10) | (10) | (10) | (10) |

TABLE 3

| | Example A | | | | |
|---|---|---|---|---|---|
| | 11 | 12 | 13 | 14 | 15 |
| Support Film (kind) | PI | PET | Alkali-treated PET | Plasma-treated PP | Plasma-treated PI |
| Surface Tension γ (mJ/m$^2$) | 47 | 42 | 53 | 59 | 65 |
| Heat-welding Polyimide (Formula) | (11) | (11) | (11) | (11) | (11) |

In regard to the semiconductor devices of Example A (1 to 15) thus obtained, the adhesive force and the degree of defect of electroconductivity were measured. The results obtained are shown in Table 4 and Table 5. In addition, the measurements were carried out by the following methods.

[Adhesive Force]

The adhesive force was measured by a 90 degree peeling test. That is, the auxiliary wiring plate was peeled from the semiconductor chip in the perpendicular direction to the bottom of the semiconductor chip and the peeling strength at the case was defined as the adhesive force (g/cm).

[Degree of Defect of Electroconductivity]

A pressure cooker test (PCT) was carried out in saturated steam of 121° C. and after 200 hours from the beginning of the PCT, the conductivity was determined. Also, the ratio of the number of semiconductors wherein the defect of electroconductivity occurred to one hundred semiconductor devices tested was defined as the degree of defect of electroconductivity (%). In addition, the occurrence of the defect of electroconductivity is caused by the defect of the bump connection between the auxiliary wiring plate and the semiconductor chip, the corrosion of the semiconductor chip circuits, etc.

TABLE 4

| | 1 | 2 | 3 | 4 | 5 | 6 | 7 | 8 |
|---|---|---|---|---|---|---|---|---|
| Adhesive Force (g/cm) | 900 | 1000 | 1100 | 1150 | 1500 | 800 | 900 | 1050 |
| Degree of Defect of Electro-conductivity (%) | 0 | 0 | 0 | 0 | 0 | 0 | 0 | 0 |

TABLE 5

| | Example A | | | | | | |
|---|---|---|---|---|---|---|---|
| | 9 | 10 | 11 | 12 | 13 | 14 | 15 |
| Adhesive Force (g/cm) | 1100 | 1750 | 400 | 400 | 420 | 500 | 600 |
| Degree of Defect of Electro-conductivity (%) | 0 | 0 | 0 | 0 | 0 | 0 | 0 |

From the results shown in Table 4 and Table 5, it can be seen that in the semiconductor devices of Example A each having formed therein the heat-welding polyimide resin layer, the adhesive force of the semiconductor chip and the auxiliary wiring plate was high and the defect of electroconductivity did not occur. Thus, it can be said that the semiconductor devices, wherein the gap of the auxiliary wiring plate and the semiconductor chip was encapsulated by the formation of the heat-welding polyimide resin layer, were excellent in the reliability. In particular, in the semiconductor devices of Example A wherein the surface tension of the support film was 35 mJ/m$^2$ or higher, good results were obtained.

EXAMPLE B (1 TO 20)

In Example B, each definite uneven surface was formed as the surface of each support film. That is, by following the same procedure as in Example A except that the support films and the heat-welding polyimide films shown in Table 6 to Table 9 below were used, semiconductor devices were prepared.

In addition, in the following Tables 6 to 9, ion etching was carried out to the support film by generating ion by performing high-frequency discharging for 5 minutes under the conditions of 3×10$^{-3}$ torr (0.4 Pa) and 13.56 MHz in a nitrogen atmosphere. The solvent treatment was carried out by immersing the support film in xylene heated to 80° C. for 3 hours. The ultraviolet (UV) treatment was carried out by irradiating the support film with ultraviolet rays of 100 W, and also the alkali treatment was carried out by immersing the support film in an aqueous solution of 0.1N potassium hydroxide for 5 hours. The corona treatment was carried out by applying low-frequency corona discharging at 1200 kHz and 33 W for one minute.

TABLE 6

| | Example B | | | | |
|---|---|---|---|---|---|
| Support Film | 1 | 2 | 3 | 4 | 5 |
| Material | PI | PET | PMP | PPS | PES |
| Thickness (μm) | 50 | 50 | 80 | 30 | 20 |
| Surface Treatment | Ion Etching | Ion Etching | Ion Etching | Ion Etching | Ion Etching |
| Surface Unevenness (μm) | 0.05 | 0.06 | 0.07 | 0.01 | 0.03 |
| Heat-Welding Polyimide (Formula) | (9) | (9) | (9) | (9) | (9) |

PI: Polyimide;
PET: Polyethylene terephthalate;
PMP: Polymethylpentene;
PPS: Polyphenylene sulfide;
PES: Polyether sulfone

TABLE 7

| | Example B | | | | |
|---|---|---|---|---|---|
| Support Film | 6 | 7 | 8 | 9 | 10 |
| Material | PEEK | Teflon | PI | PET | PMP |
| Thickness (μm) | 40 | 100 | 50 | 50 | 80 |
| Surface Treatment | Ion Etching | Ion Etching | Ion Etching | Ion Etching | Ion Etching |
| Surface Unevenness (μm) | 0.04 | 0.08 | 0.05 | 0.06 | 0.07 |
| Heat-Welding Polyimide (Formula) | (9) | (9) | (10) | (10) | (10) |

PEEK: Polyether ether ketone;
PI: Polyimide;
PET: Polyethylene terephthalate;
PMP: Polymethylpentene

TABLE 8

| | Example B | | | | |
|---|---|---|---|---|---|
| Support Film | 11 | 12 | 13 | 14 | 15 |
| Material | PPS | PES | PEEK | Teflon | PMP |
| Thickness (μm) | 30 | 20 | 40 | 100 | 80 |
| Surface Treatment | Ion Etching | Ion Etching | Ion Etching | Ion Etching | Solvent Treatment |
| Surface Unevenness (μm) | 0.01 | 0.03 | 0.04 | 0.06 | 0.08 |
| Heat-welding Polyimide (Formula) | (10) | (10) | (10) | (10) | (10) |

PPS: Polyphenylene sulfide;
PES: Polyether sulfone;
PEEK: Polyether ether ketone;
PMP: Polymethylpentene

TABLE 9

| | Example B | | | | |
|---|---|---|---|---|---|
| Support Film | 16 | 17 | 18 | 19 | 20 |
| Material | PET | PI | PET | PI | PI |
| Thickness (μm) | 50 | 50 | 50 | 50 | 50 |
| Surface Treatment | Alkali Treatment | UV Treatment | Corona Treatment | Sand Blast | Ion Etching |
| Surface Unevenness (μm) | 0.1 | 0.02 | 0.1 | 0.18 | 0.05 |
| Heat-welding Polyimide (General Formula) | (10) | (10) | (10) | (10) | (11) |

PET: Polyethylene terephthalate;
PI: Polyimide

In regard to the semiconductor devices of Example B (1 to 20) thus obtained, the adhesive force and the degree of defect of electroconductivity were measured by the methods described above. The results are shown in Tables 10 to 12.

TABLE 10

| | Example B | | | | | | |
|---|---|---|---|---|---|---|---|
| | 1 | 2 | 3 | 4 | 5 | 6 | 7 |
| Adhesive Force (g/cm) | 2000 | 1800 | 1350 | 750 | 850 | 1000 | 300 |
| Degree of Defect of Electro-conductivity (%) | 0 | 0 | 0 | 0 | 0 | 0 | 0 |

TABLE 11

| | Example B | | | | | | |
|---|---|---|---|---|---|---|---|
| | 8 | 9 | 10 | 11 | 12 | 13 | 14 |
| Adhesive Force (g/cm) | 2300 | 1800 | 1850 | 800 | 830 | 1050 | 330 |
| Degree of Defect of Electro-conductivity (%) | 0 | 0 | 0 | 0 | 0 | 0 | 0 |

TABLE 12

| | Example B | | | | | |
|---|---|---|---|---|---|---|
| | 15 | 16 | 17 | 18 | 19 | 20 |
| Adhesive Force (g/cm) | 600 | 1300 | 1600 | 1200 | 700 | 700 |
| Degree of Defect of Electro-conductivity (%) | 0 | 0 | 0 | 0 | 0 | 0 |

From the results shown in Tables 10 to 12 above, it can be seen that in each of the semiconductor devices of Example B, wherein a definite uneven surface was formed on the support film, the adhesive force of the semiconductor chip and the auxiliary wiring plate became very high. Also, in the semiconductor devices of Example B, the defect of electroconductivity did not occur. Thus, it can be said that by forming a definite uneven surface on the auxiliary wiring plate, the reliability of the semiconductor device can be more improved.

EXAMPLE C-1

A high-molecular weight film comprising a polyimide film (auxiliary wiring plate) having a copper circuit of a definite pattern on the back surface thereof equipped with gold bumps (50 µm height) electrically connected to the copper circuit on the surface thereof was prepared, and the heat-welding polyimide film (30 µm thick) represented by the formula (9) above was adhered on the surface of the high-molecular film by a heat lamination to obtain a tape carrier for semiconductor device. The tape carrier for semiconductor device was of the type A wherein the internal electrodes (the gold bumps) were covered with the heat-welding polyimide film.

Figure 10A:
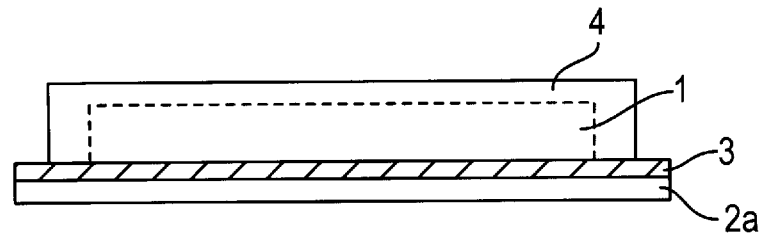
FIG. 10(A) is a configurational view showing the construction of an embodiment of the semiconductor device of the present invention.

The semiconductor chip for a reliability evaluation which was the same as that of Example A was mounted on the tape carrier for semiconductor device, the bump connection was carried out by heat-press adhering (at 350° C.), and the heat-welding polyimide resin layer was formed to obtain a semiconductor device of the CSP type. The configurational view of the semiconductor device is shown in FIG. 10(A). In FIG. 10(A), numeral 1 is the semiconductor chip, numeral 2*a* is the high-molecular weight film, numeral 3 is the heat-welding polyimide film, and numeral 4 is the encapsulating resin.

EXAMPLE C (2 TO 5)

By following the same procedure as in Example C-1 except that in Example C-2, the heat-welding polyimide represented by the formula (11) above was used, in Example C-3, the heat-welding polyimide represented by the formula (10) above was used, in Example C-4, the heat-welding polyimide represented by the formula (12) above, and in Example C-5, the heat-welding polyimide represented by the formula (13) above was used, semiconductor devices were produced.

Comparative Example C-1

By following the same procedure as in Example C-1 except that the heat-welding polyimide film was not used, a semiconductor device was produced.

Comparative Example C-2

By following the same procedure as in Comparative Example C-1, a semiconductor device was produced. The gap between the semiconductor chip and the auxiliary wiring plate (the high-molecular weight film) of the semiconductor device was encapsulated by the formation of the epoxy resin layer. That is, by compounding 100 parts by weight of a bisphenol A-type epoxy resin (epoxy equivalent: 180), 100 parts by weight of methylhexahydrophthalic anhydride (acid equivalent: 162), and 0.5 part by weight of 2-methylimidazole (curing catalyst), a liquid epoxy resin composition for encapsulation was prepared by an ordinary manner. The epoxy resin composition was injected in the gap between the semiconductor chip and the auxiliary wiring plate using a dispenser followed by curing to form the epoxy resin layer.

In regard to the semiconductor devices of Example C (1 to 5) and Comparative Example C (1 and 2), the adhesive force and the degree of defect of electroconductivity were measured by the methods shown below. The results are shown in Table 13 below.

[Adhesive Force]

Figure 10B:
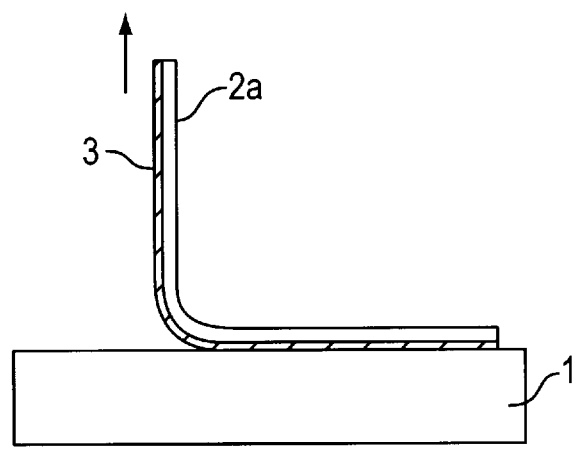
FIG. 10(B) is a configurational view showing the state of measuring the adhesive force of the tape carrier for semiconductor device.

By adhering the tape carrier for semiconductor device to a semiconductor chip, a test material for measuring adhesive force was prepared. Also, as shown in FIG. 10(B), the adhesive force was measured by carrying out the 90 degree peeling test in the same method described above.

[Degree of Defect of Electroconductivity]

The degree of defect of electroconductivity after performing PCT was measured in the same method as described above.

TABLE 13

|  | Example C | | | | | Comparative Example C | |
|---|---|---|---|---|---|---|---|
|  | 1 | 2 | 3 | 4 | 5 | 1 | 2 |
| Adhesive Force (g/cm) | 1200 | 1100 | 1350 | 1080 | 1270 | — | 100 |
| Degree of Defect of Electroconductivity (%) | 1 | 1 | 0 | 1 | 0 | 95 | 78 |

From the results shown in Table 13 above, it can be seen that the tape carriers for semiconductor device of Example C each having the heat-welding polyimide film have a high adhesive force and in the semiconductor devices (each having formed the heat-welding polyimide resin layer) produced using each of the tape carriers, the defect of electroconductivity did not occur or the degree of defect of electroconductivity was very low, which showed that in the semiconductor devices of Example C, the adhesive force of the semiconductor chip and the heat-welding polyimide resin layer and the adhesive force of the auxiliary wiring plate and the heat-welding polyimide resin layer were very high, whereby the reliability (in particular, the moisture-proof reliability) of the semiconductor devices was excellent. Also, in the production of the semiconductor devices of Example C, since the tape carrier for semiconductor device was used, the works such as the formation of the heat-welding polyimide resin layer, etc., could be efficiently carried out.

On the other hand, from the results shown in Table 13 above, it can also be seen that in the tape carrier for semiconductor device of Comparative Example C-1 which did not have a heat-welding polyimide film, the tape carrier did not have the adhesive force to the semiconductor chip and in the semiconductor device using the tape carrier, the defect of electroconductivity occurred much. Also, in the semiconductor device of Comparative Example C-2 having formed therein the epoxy resin layer in place of the heat-welding polyimide resin encapsulation layer, the adhesive force of the semiconductor chip and the epoxy resin layer and the adhesive force of the auxiliary wiring plate and the epoxy resin layer were low and the defect of electroconductivity occurred much.

EXAMPLE D

As an auxiliary wiring plate, the auxiliary wiring plate having formed on a support film the heat-welding polyimide resin layer represented by the formula (9) above by a coating method was used. Also, a semiconductor device was produced by mounting a semiconductor chip on the heat-welding polyimide resin layer of the auxiliary wiring plate and also by following the same manners as Example A-1 as other steps.

In regard to the semiconductor device thus obtained, the adhesive force and the degree of defect of electroconductivity were measured in the same methods as in Example A. The results showed that the adhesive force was 900 g/cm and the degree of defect of electroconductivity was 0%. Thus, it can be said that in the semiconductor device of Example D, the adhesive force of the semiconductor chip and the heat-welding polyimide resin layer and the adhesive force of the auxiliary wiring plate and the heat-welding polyimide resin layer were very high, whereby the reliability (in particular, the moisture-proof reliability) of the semiconductor device was excellent.

EXAMPLE E

A tape carrier for semiconductor device of the type B was produced in the method described above. That is, first, a polyimide film (auxiliary wiring plate) having formed a copper circuit of a definite pattern on the back surface thereof was prepared. The heat-welding polyimide film of 30 $\mu$m thick represented by the formula (9) above was adhered on the surface of the polyimide film by a heat lamination. Through the steps of perforating, metal filling, metal bump forming, etc., by the methods described above, metal bumps (height 50 $\mu$m) electrically connected to the copper circuit were formed on the surface of the polyimide film to obtain the tape carrier for semiconductor device of the type B. Using the tape carrier, a semiconductor device was produced in the same procedure as in Example C-1.

In regard to the semiconductor device thus obtained, the adhesive force and the degree of defect of electroconductivity were measured in the same methods as in Example C. As a result thereof, the adhesive force was 1200 g/cm and the degree of defect of electroconductivity was 1%. Thus, it can be said that the tape carrier for semiconductor device of Example E was excellent in the adhesive property to the semiconductor chip. Also, in the semiconductor device produced using the tape carrier for semiconductor device, the adhesive force of the semiconductor chip and the heat-welding polyimide resin layer and the adhesive force of the auxiliary wiring plate and the heat-welding polyimide resin layer were very high, whereby it can be said that the semiconductor device was excellent in the reliability (in particular, moisture-proof reliability). Also, in the production of the semiconductor device, since the tape carrier for semiconductor device was used, the works such as the formation of the heat-welding polyimide resin layer, etc., could be efficiently carried out and also heat-press adhering, etc. could be carried out under mild conditions.

EXAMPLE F (1–15)

By following the same procedure as in Example A except that each of heat-welding polyimide films of a double layer structure each having a primer layer was used, semiconductor devices of the CSP type were produced. In addition, the kinds of the support films and the heat-welding polyimide films of a double layer structure are as shown in Table 14 to Table 16 below.

In addition, in the tables, PI shows a polypropylene film, PET a polyethylene terephthalate film, and PP a polypropylene film. Also, the alkali treatment was carried out by immersing the support film in an aqueous solution of 0.1N potassium hydroxide for 5 hours, and the plasma treatment was carried out by applying a glow discharging treatment to the support film under the conditions of 100 W, 13.56 mHz, and 30 seconds in an oxygen gas atmosphere of 0.1 torr. Also, the surface tension was measured by a contact angle method using the Fowkes's equation.

TABLE 14

| | Example F | | | | |
|---|---|---|---|---|---|
| | 1 | 2 | 3 | 4 | 5 |
| Support Film | PI | PET | Alkali-Treated PET | Plasma-Treated PP | Plasma-treated PI |
| Surface Tension γ (mJ/m²) | 47 | 42 | 53 | 59 | 65 |
| Heat-Welding Polyimide (Formula) | (9) | (9) | (9) | (9) | (9) |
| Primer Layer (Formula) | (14) | (14) | (14) | (14) | (14) |

TABLE 15

| | Example F | | | | |
|---|---|---|---|---|---|
| | 6 | 7 | 8 | 9 | 10 |
| Support Film | PI | PET | Alkali-Treated PET | Plasma-Treated PP | Plasma-Treated PI |
| Surface Tension γ (mJ/m²) | 47 | 42 | 53 | 59 | 65 |
| Heat-Welding Polyimide (Formula) | (10) | (10) | (10) | (10) | (10) |
| Primer Layer (Formula) | (14) | (14) | (14) | (14) | (14) |

TABLE 16

| | Example F | | | | |
|---|---|---|---|---|---|
| | 11 | 12 | 13 | 14 | 15 |
| Support Film | PI | PET | Alkali-Treated PET | Plasma-Treated PP | Plasma-Treated PI |
| Surface Tension γ (mJ/m²) | 47 | 42 | 53 | 59 | 65 |
| Heat-Welding Polyimide (Formula) | (11) | (11) | (11) | (11) | (11) |
| Primer Layer (Formula) | (14) | (14) | (14) | (14) | (14) |

In regard to the semiconductor devices of Example F (1 to 15) thus obtained, the adhesive force and the degree of defect of electroconductivity were measured in the same methods as in Example A. The results are shown in Table 17 and Table 18 below.

TABLE 17

| | Example F | | | | | | | |
|---|---|---|---|---|---|---|---|---|
| | 1 | 2 | 3 | 4 | 5 | 6 | 7 | 9 |
| Adhesive Force (g/cm) | 1200 | 1250 | 1380 | 1550 | 1700 | 1200 | 1250 | 1400 |
| Degree of Defect of Electro-conductivity (%) | 0 | 0 | 0 | 0 | 0 | 0 | 0 | 0 |

TABLE 18

| | Example F | | | | | | |
|---|---|---|---|---|---|---|---|
| | 9 | 10 | 11 | 12 | 13 | 14 | 15 |
| Adhesive Force (g/cm) | 1600 | 1700 | 550 | 590 | 600 | 700 | 750 |
| Degree of Defect of Electro-conductivity (%) | 0 | 0 | 0 | 0 | 0 | 0 | 0 |

From the results shown in Tables 17 and 18 above, it can be seen that in Example F, by the formation of the primer layer, the adhesive force was greatly improved. Also, in Example F, the defect of electroconductivity did not occur. From the results, it can be said that by the formation of the primer layer, the adhesive force of the heat-welding polyimide resin layer and the auxiliary wiring plate was improved and the reliability of the semiconductor device was also improved.

EXAMPLE G (1 TO 20)

By following the same procedure as in Example B except that each of heat-welding polyimide films of a double structure each having a primer layer was used, semiconductor devices of the CSP type were produced. In addition, the kinds of the support films and the heat-welding polyimide films of double layer structure used are shown in Table b 19to Table 22 below.

In addition, in the tables, ion etching was carried out to the support film by generating an ion by carrying out high-frequency discharging under the conditions of $3 \times 10^{-3}$ torr (0.4 Pa) and 13.56 mHz for 5 minutes in a nitrogen gas atmosphere. The solvent treatment was carried out by immersing the support film in xylene heated to 80° C. for 3 hours. The ultraviolet (UV) treatment was carried out by irradiating the support film with ultraviolet rays of 100 W and the alkali treatment was carried out by immersing the support film in an aqueous solution of 0.1N potassium hydroxide for 5 hours. The corona treatment was carried out by irradiating low-frequency corona discharging of 1200 kHz and 33 W for one minute.

TABLE 19

| | Example G | | | | |
|---|---|---|---|---|---|
| Support Film | 1 | 2 | 3 | 4 | 5 |
| Material | PI | PET | PMP | PPS | PES |
| Thickness (μm) | 50 | 50 | 80 | 30 | 20 |
| Surface Treatment | Ion Etching | Ion Etching | Ion Etching | Ion Etching | Ion Etching |
| Surface Unevenness (μm) | 0.05 | 0.06 | 0.07 | 0.01 | 0.03 |
| Heat-welding Polyimide (Formula) | (9) | (9) | (9) | (9) | (9) |
| Primer Layer (Formula) | (14) | (14) | (14) | (14) | (14) |

PI: Polyimide;
PET: Polyethylene terephthalate;
PMP: Polymethylpentene;
PPS: Polyphenylene sulfide;
PES: Polyether sulfone

TABLE 20

| | Example G | | | | |
|---|---|---|---|---|---|
| Support Film | 6 | 7 | 8 | 9 | 10 |
| Material | PEEK | Teflon | PI | PET | PMP |
| Thickness (μm) | 40 | 100 | 50 | 50 | 80 |
| Surface Treatment | Ion Etching | Ion Etching | Ion Etching | Ion Etching | Ion Etching |
| Surface Unevenness (μm) | 0.04 | 0.08 | 0.05 | 0.06 | 0.07 |
| Heat-Welding Polyimide (Formula) | (10) | (10) | (10) | (10) | (10) |
| Primer Layer (Formula) | (14) | (14) | (14) | (14) | (14) |

PEEK: Polyether ether ketone;
PI: Polyimide;
PET: Polyethylene terephthalate;
PMP: Polymethylpentene

TABLE 21

| | Example G | | | | |
|---|---|---|---|---|---|
| Support Film | 11 | 12 | 13 | 14 | 15 |
| Material | PPS | PES | PEEK | Teflon | PMP |
| Thickness (μm) | 30 | 20 | 40 | 100 | 80 |
| Surface Treatment | Ion Etching | Ion Etching | Ion Etching | Ion Etching | Solvent Treatment |
| Surface Unevenness (μm) | 0.01 | 0.03 | 0.04 | 0.06 | 0.08 |
| Heat-Welding Polyamide (Formula) | (11) | (11) | (11) | (11) | (11) |
| Primer Layer (Formula) | (14) | (14) | (14) | (14) | (14) |

PPS: Polyphenylene sulfide;
PES: Polyether sulfone;
PEEK: Polyether ether ketone;
PMP: Polymethyl pentene

TABLE 22

| | Example G | | | | |
|---|---|---|---|---|---|
| Support Film | 16 | 17 | 18 | 19 | 20 |
| Material | PET | PI | PET | PI | PI |
| Thickness (μm) | 50 | 50 | 50 | 50 | 50 |
| Surface Treatment | Alkali Treatment | UV Treatment | Corona Treatment | Sand Blast | Ion Etching |
| Surface Unevenness (μm) | 0.1 | 0.02 | 0.1 | 0.18 | 0.05 |
| Heat-Welding Polymer (Formula) | (9) | (9) | (9) | (9) | (9) |
| Primer Layer (Formula) | (14) | (14) | (14) | (14) | (14) |

PET: Polyethylene terephthalate;
PI: Polyimide

In regard to the semiconductor devices of Example G (1 to 20) thus obtained, the adhesive force and the degree of defect of electroconductivity were measured in the same methods as in Example B.

The results obtained are shown in Tables 23 to 25 below.

TABLE 23

| | Example G | | | | | | |
|---|---|---|---|---|---|---|---|
| | 1 | 2 | 3 | 4 | 5 | 6 | 7 |
| Adhesive Force (g/cm) | 2200 | 1900 | 1400 | 900 | 950 | 1200 | 480 |
| Degree of Defect of Electroconductivity (%) | 0 | 0 | 0 | 0 | 0 | 0 | 0 |

TABLE 24

| | Example G | | | | | | |
|---|---|---|---|---|---|---|---|
| | 8 | 9 | 10 | 11 | 12 | 13 | 14 |
| Adhesive Force (g/cm) | 2500 | 1950 | 1980 | 1100 | 1200 | 1250 | 600 |
| Degree of Defect of Electroconductivity (%) | 0 | 0 | 0 | 0 | 0 | 0 | 0 |

TABLE 25

| | Example G | | | | | |
|---|---|---|---|---|---|---|
| | 15 | 16 | 17 | 18 | 19 | 20 |
| Adhesive Force (g/cm) | 770 | 1500 | 1800 | 1500 | 900 | 850 |
| Degree of Defect of Electroconductivity (%) | 0 | 0 | 0 | 0 | 0 | 0 |

From the results shown in Tables 23 to 25 described above, it can be seen that in the semiconductor devices of Example G each forms the primer layer and forming the definite uneven surface on each support film, the adhesive force became very high. Also, in the semiconductor devices of Example G, the defect of electroconductivity did not occur. From the results, it can be said that by the formation of the primer layer and the formation of unevenness on the surface of the auxiliary wiring plate, the adhesive force of the heat-welding polyimide resin layer and the auxiliary wiring plate was greatly improved and the reliability of the semiconductor devices was also improved.

EXAMPLE H

As an auxiliary wiring plate, the auxiliary wiring plate having previously formed in a support film the primer layer of the formula (14) above and the heat-welding polyimide resin layer of the formula (9) above by a coating method was used. A semiconductor device was produced by mounting a semiconductor chip on the heat-welding polyimide resin layer of the auxiliary wiring plate and by following the same steps as in Example F-1 as other steps.

In regard to the semiconductor device thus obtained, the adhesive force and the degree of defect of electroconductivity were measured in the same methods as in Example F. As a result thereof, the adhesive force was 1200 g/cm and the degree of defect of electroconductivity was 0%. From the results, it can be said that in the semiconductor device of Example H, by the formation of the primer layer, the adhesive force of the auxiliary wiring plate and the heat-welding polyimide resin layer became very high and the reliability (in particular, the moisture-proof reliability) of the semiconductor device was excellent.

EXAMPLE J

A tape carrier for semiconductor device of the type B having a primer layer was prepared in the same method as described above. That is, first, a polyimide film (auxiliary wiring plate) having formed a copper circuit of a definite patter on the back surface was prepared. On the front surface of the polyimide film were successively adhered a polyimide film (for forming the primer layer) represented by the formula (14) above and a heat-welding polyimide film (30 μm thick) represented by the formula (9) above by heat lamination. Through the steps of perforating, metal filling, gold bump forming, etc., by the methods described above, gold bumps (50 μm height) electrically connected to the copper circuit were formed on the surface of the polyimide film to obtain the tape carrier for semiconductor device of the type B. Using the tape carrier, a semiconductor device was produced in the same manner as in Example C-1.

In regard to the semiconductor device thus obtained, the adhesive force and the degree of defect of electroconductivity were measured in the same methods as in Example C. As a result thereof, the adhesive force was 1000 g/cm and the degree of defect of electroconductivity was 0%. From the results, it can be said that in the semiconductor device produced using the tape carrier for semiconductor device, by the formation of the primer layer, the adhesive force of the auxiliary wiring plate and the heat-welding polyimide resin layer became very high and the reliability (in particular, the moisture-proof reliability) of the semiconductor device was excellent.

Also, since in the production of the semiconductor device, the tape carrier for semiconductor device was used, the work of the formation of the heat-welding polyimide resin layer, etc., could be efficiently carried out and also heat-press adhering could be carried out under a mild condition.

EXAMPLE K (1 TO 91

A polyimide represented by the following formula (16) and a polyimide represented by the following formula (17)

were prepared. These polyimides were unmodified polymers.

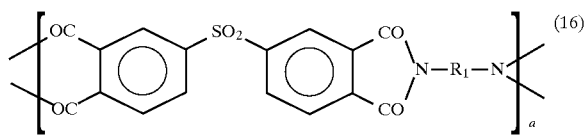

wherein $R_1$ represents

; a represents 1.00; and n represents 9.

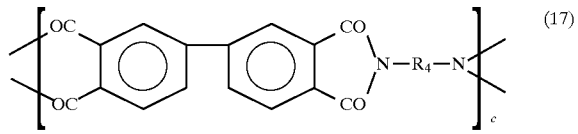

wherein $R_4$ represents

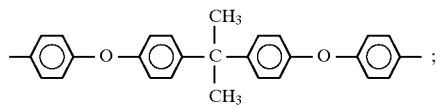

; c represents 1.00; and n represents 1.

EXAMPLE K-1

By following the same procedure as in Example A-1 except that the polyimide represented by the formula (16) above was used, a semiconductor device was produced. The kind of the support film of the semiconductor device was the polyimide and the surface tension y thereof was 47 mJ/m$^2$.

EXAMPLE K-2

By following the same procedure as in Example B-1 except that the polyimide represented by the formula (16) above was used, a semiconductor device was produced. The support film of the semiconductor device was a polyimide film of 50 μm thick and the surface state became the uneven surface of 0.05 μm by ion etching.

EXAMPLE K-3

By following the same procedure as in Example C-1 except that the polyimide represented by the formula (16) above was used, a semiconductor device was produced using a tape carrier (type A) for semiconductor device. Also, a test material for measuring the adhesive force was prepared as in Example C.

EXAMPLE K-4

By following the same procedure as in Example E except that the polyimide represented by the formula (16) above was used, a semiconductor device was produced according to the second production method described above.

EXAMPLE K-5

By following the same procedure as in Example E except that the polyimide represented by the formula (16) above, a semiconductor device was produced using the tape carrier (type B) for semiconductor device. Also, a test material for measuring the adhesive force was prepared as in Example C.

EXAMPLE K-6

By following the same procedure as in Example F-1 except that the polyimide represented by the formula (16) above was used as the heat-welding polyimide and the polyimide represented by the formula (17) above was used for the formation of a primer layer, a semiconductor device of the type CSP was produced.

EXAMPLE K-7

By following the same procedure as in Example C-1 except that the polyimide represented by the formula (16) above was used as the heat-welding polyimide and the polyimide represented by the formula (17) above was used for the formation of a primer layer, a semiconductor device of the type CSP was produced.

EXAMPLE K-8

By following the same procedure as in Example H except that the polyimide represented by the formula (16) above was used as the heat-welding polyimide and the polyimide represented by the formula (17) above was used for the formation of a primer layer, a semiconductor device of the type CSP was produced.

EXAMPLE K-9

By following the same procedure as in Example J except that the polyimide represented by the formula (16) above was used as the heat-welding polyimide and the polyimide represented by the formula (17) above was used for the formation of a primer layer, a tape carrier for semiconductor device of the type B was prepared and using the tape carrier, a semiconductor device was produced. Also, a test material for measuring the adhesive force was prepared as in Example C.

In regard to the semiconductor devices (Examples K-1 to K-9) thus produced, the adhesive force, the degree of defect of electroconductivity, and the degree of defect of electroconductivity at high temperature were determined. The results are shown in Table 26 below.

In addition, the adhesive force was measured about Examples K-1, K-2, K-4, K-6, K-7, and K-8 in the same method as in Example A and measured about Examples K-3, K-5, and K-9 in the same method as in Example A. The degree of defect of electroconductivity was measured in the same method as in Example A. The degree of defect of electroconductivity at high temperature was measured as follows.

[Degree of Defect of Electroconductivity at High Temperature]

After applying infrared reflow at 240° C. for 10 seconds to the semiconductor devices stored under the conditions of 85° C. and 85% RH for 100 hours, the conductivity was determined. The ratio of the number of the semiconductor devices wherein the defect of electroconductivity occurred to total (one 10 hundred) semiconductor devices tested was defined as the degree of defect of electroconductivity (%).

The occurrence of the defect of electroconductivity at high temperature was caused by peeling between the auxiliary wiring plate and the semiconductor chip by the steam explosion (popcorn phenomenon) at the infrared reflow treatment. In addition, as a reference, the result of measuring the degree of defect of electroconductivity under high temperature about the semiconductor device of Example A-1 was lower than 1%.

TABLE 26

| | Example K | | | | | | | | |
|---|---|---|---|---|---|---|---|---|---|
| | 1 | 2 | 3 | 4 | 5 | 6 | 7 | 8 | 9 |
| (A) (g/cm) | 2000 | 1850 | 1580 | 2000 | 1900 | 1200 | 1450 | 1700 | 1000 |
| (B) (%) | 0 | 0 | 0 | 0 | 0 | 0 | 0 | 0 | 0 |
| (C) (%) | 0 | 0 | 0 | 0 | 0 | 0 | 0 | 0 | 0 |

(A): Adhesive force
(B): Degree of Defect of Electroconductivity
(C): Degree of Defect of Electroconductivity at high temperature As described above, from the result of Example K, it can be seen that in the semiconductor devices using unmodified polyimide resins, the adhesive force and the prevention of defect of electroconductivity are inferior a little to the semiconductor devices using the silicone-modified polyimide resins, but there is no problem for practical use. Furthermore, it can be said that as compared with the semiconductor device of the Reference Example (Example A-1), the semiconductor devices of Example K are excellent in the prevention of defect of electroconductivity at high temperature such as a soldering reflow.

While the invention has been described in detail and with reference to specific embodiments thereof, it will be apparent to one skilled in the art that various changes and modifications can be made therein without departing from the spirit and scope thereof.

What is claimed is:

1. A semiconductor device, wherein a semiconductor chip equipped with at least one electrode is mounted on an auxiliary wiring plate, wherein the auxiliary wiring plate has a surface to which the semiconductor chip is mounted such that the electrode side of the semiconductor chip faces the surface of the auxiliary wiring plate, at least one leading conductor is disposed in the inside of said auxiliary wiring plate, one end of the leading conductor forms an internal electrode projecting from the surface of said auxiliary wiring plate at the semiconductor chip-mounting side, the other end of the leading conductor forms an external electrode projecting from the surface of said auxiliary wiring plate at the opposite side to said semiconductor chip-mounting side, and said internal electrode is connected to the electrode of the semiconductor chip, at least a gap between the semiconductor chip and the auxiliary wiring plate being encapsulated with a heat-welding polyimide resin layer, wherein said heat-welding polyimide resin layer is formed by at least one of the heat-welding polyimides represented by the following formulae (1) to (5);

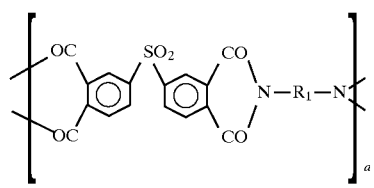
(1)

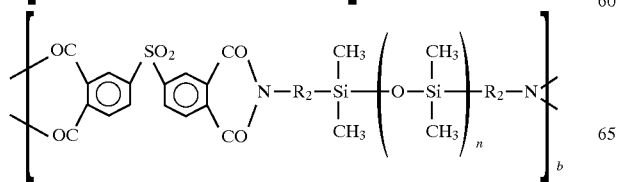

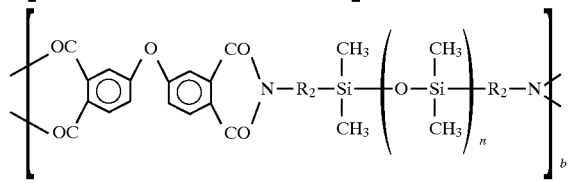
(2)

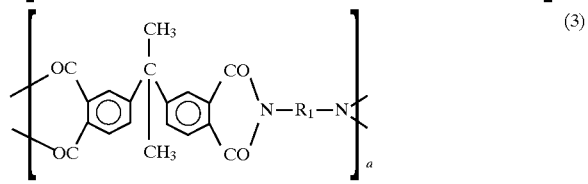

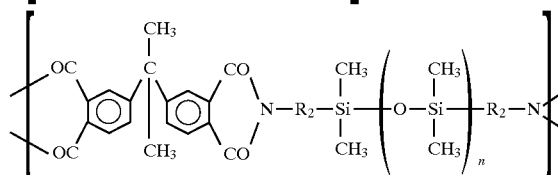
(3)

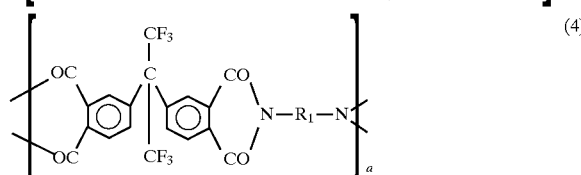

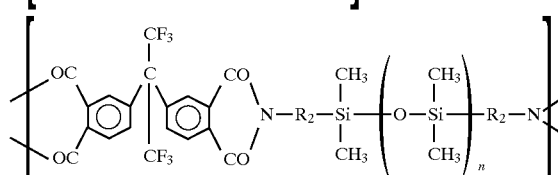
(4)

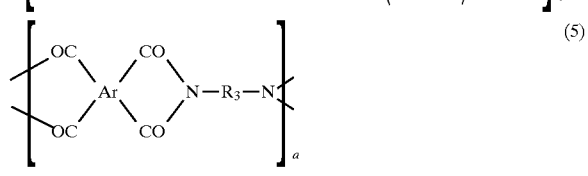

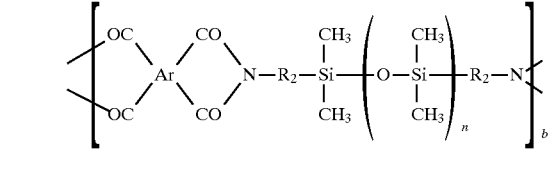
(5)

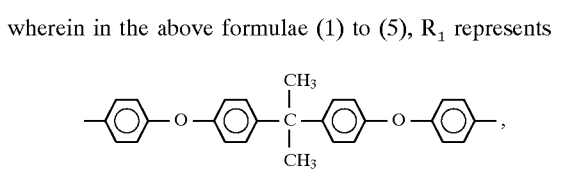

wherein in the above formulae (1) to (5), $R_1$ represents

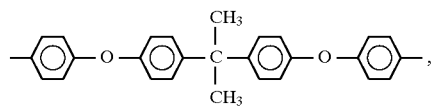

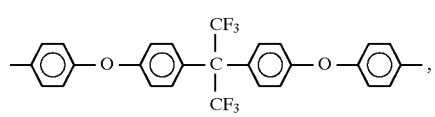

-continued

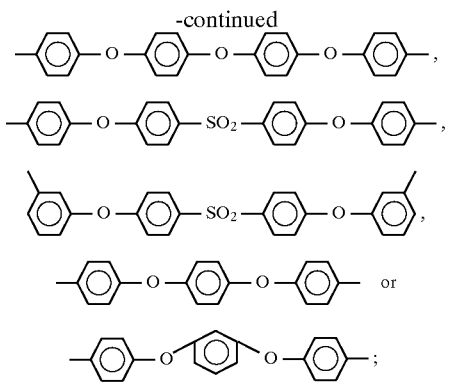

$R_2$ represents —$C_3H_6$—, —$C_4H_8$—, or

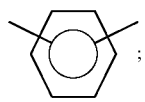

$R_3$ represents an aromatic silicon-free diamine residue; Ar represents an aromatic tetracarboxylic acid residue; n represents an integer of from 1 to 100; a and b represent numbers satisfying the relationship of a+b=1 and the relationship of $0.3 \leq a/(a+b) \leq 1.00$; and the polyimide of formulae (1) to (5) may be a random copolymer or a block copolymer.

2. The semiconductor device of claim 1, wherein said heat-welding polyimide resin layer has a primer layer at the side of being brought into contact with said auxiliary wiring plate and the heat-welding polyimide resin layer is contacted with the auxiliary wiring plate via the primer layer.

3. The semiconductor device of claim 1, wherein said heat-welding polyimide resin layer is formed by a heat-welding polyimide having a glass transition temperature of 300° C. or less.

4. The semiconductor device of claim 1, wherein in the formulae (1) to (5), a and b are numbers satisfying the relationship of a+b=1 and the relationship of $0.3 \leq a/(a+b) \leq 0.99$.

5. A semiconductor device, wherein a semiconductor chip equipped with at least one electrode is mounted on an auxiliary wiring plate, wherein the auxiliary wiring plate has a surface to which the semiconductor chip is mounted such that the electrode side of the semiconductor chip faces the surface of the auxiliary wiring plate, at least one leading conductor is disposed in the inside of said auxiliary wiring plate, one end of the leading conductor forms an internal electrode projecting from the surface of said auxiliary wiring plate at the semiconductor chip-mounting side, the other end of the leading conductor forms an external electrode projecting from the surface of said auxiliary wiring plate at the opposite side to said semiconductor chip-mounting side, and said internal electrode is connected to the electrode of the semiconductor chip, at least a gap between the semiconductor chip and the auxiliary wiring plate being encapsulated with a heat-welding polyimide resin layer, wherein said heat-welding polyimide resin layer has a primer layer at the side of being brought into contact with said auxiliary wiring plate and the heat-welding polyimide resin layer is contacted with the auxiliary wiring plate via the primer layer, wherein said primer layer is formed from at least one of the heat-welding polyimides represented by the following formulae (6) to (8);

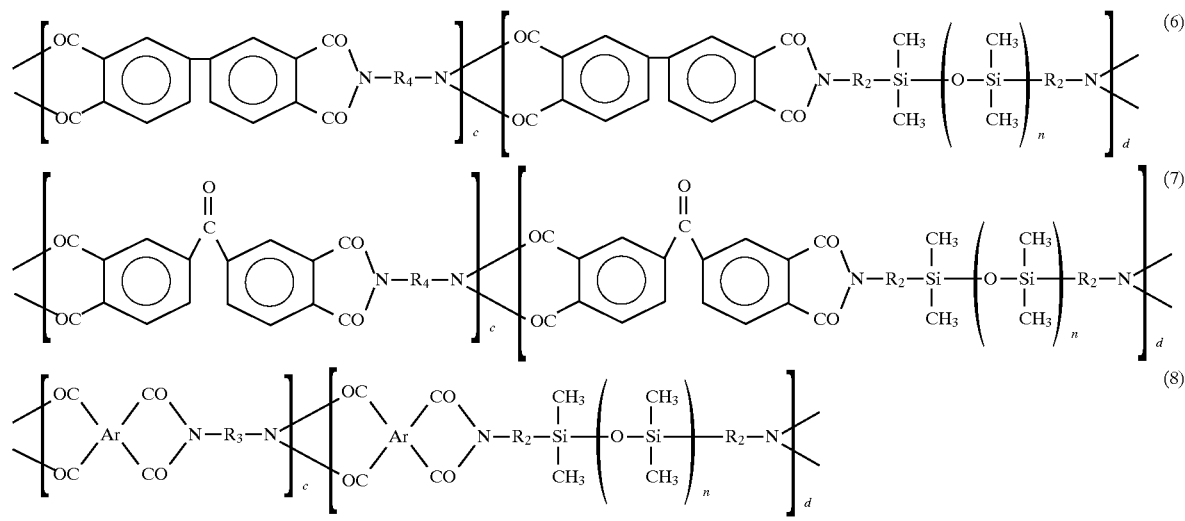

wherein in the formulae (6) to (8), $R_4$ represents

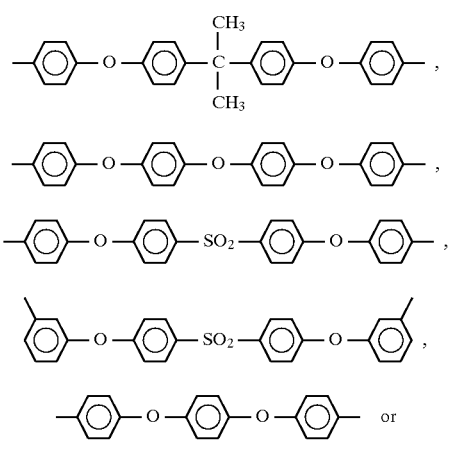

-continued

$R_2$ represents —$C_3H_6$—, —$C_4H_8$—, or

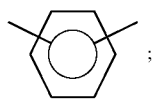

; $R_3$ represents an aromatic silicon-free diamine residue; Ar represents an aromatic tetracarboxylic acid residue; n represents an integer of from 1 to 100; c and d represent numbers satisfying the relationship of c+d=1 and the relationship of $0.3 \leq c/(c+d) \leq 1.00$; and the polyimide of formulae (6) to (8) may be a random copolymer or a block copolymer.

6. The semiconductor device of claim 5, wherein in the formulae (6) to (8), c and d are numbers satisfying the relationship of c+d=1 and the relationship of $0.3 \leq c/(c+d) \leq 0.99$.

7. The semiconductor device of claim 1 or 5, wherein the surface layer of said auxiliary wiring plate at the side of mounting the semiconductor chip is formed by a polyimide.

8. The semiconductor device of claim 1 or 5, wherein the external electrodes of said auxiliary wiring plate are formed on the surface of said auxiliary wiring plate at the opposite side to the side of mounting the semiconductor chip corresponding to the portion almost just under said internal electrodes.

9. The semiconductor device of claim 1 or 5, wherein the external electrodes of said auxiliary wiring plate are formed on the surface of said auxiliary wiring plate at the opposite side to the side of mounting the semiconductor chip at a portion deviated from the portion almost just under said internal electrodes.

10. The semiconductor device of claim 1 or 5, wherein said auxiliary wiring plate has a multilayer structure composed of a plurality of insulating layers laminated in the thickness direction.

11. The semiconductor device of claim 1 or 5, wherein the area of the surface of said auxiliary wiring plate at the side of mounting the semiconductor chip is 200% or less of the bottom surface of said semiconductor chip.

12. The semiconductor device of claim 1 or 5, wherein the area of said auxiliary wiring plate at the side of mounting the semiconductor chip is the same area as the area of the bottom surface of said semiconductor chip.

13. The semiconductor device of claim 1 or 5, wherein in the surface of said auxiliary wiring plate at the side of mounting the semiconductor chip, the surface tension of at least the portion thereof to be contacted with the heat-welding polyimide resin layer is 35 mJ/m² or higher.

14. The semiconductor device of claim 1 or 5, wherein in the surface of said auxiliary wiring plate at the side of mounting the semiconductor chip, at least the portion thereof of being brought into contact with the heat-welding polyimide resin layer has an uneven surface having a diameter of from 0.005 to 0.5 µm.

15. A tape carrier for semiconductor device, wherein at least one leading conductor is disposed in the inside of a high-molecular weight film, one end of the leading conductor forms an internal electrode projecting from the surface of said high-molecular weight film, the other end of said leading conductor forms an external electrode projecting from the back surface of said high-molecular weight film, and the surface of said high-molecular weight film including the surface of said internal electrode is covered with a heat-welding polyimide film formed by at least one of heat-welding polyimides each represented by the following formulae (1) to (5);

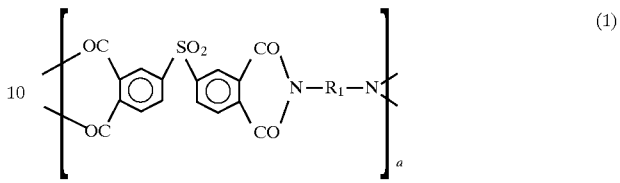

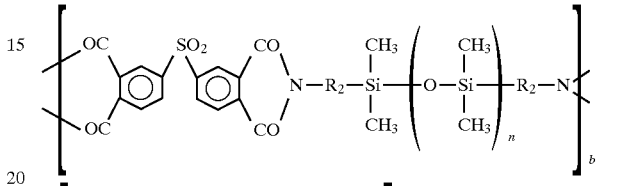

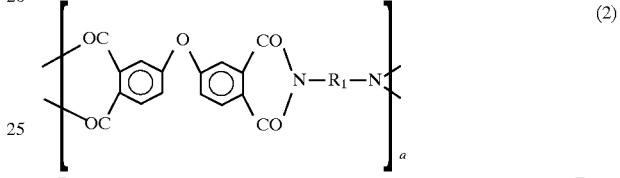

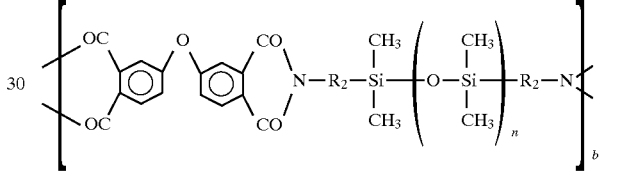

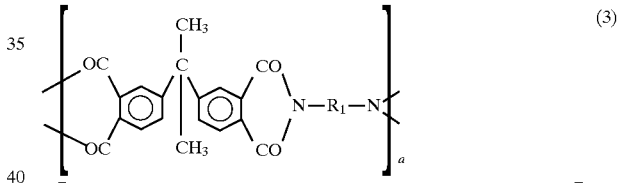

-continued

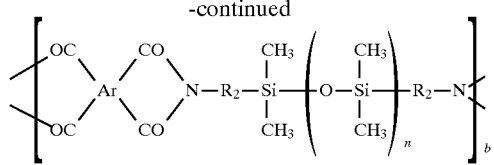

In the formulae (1) to (5), $R_1$ represents

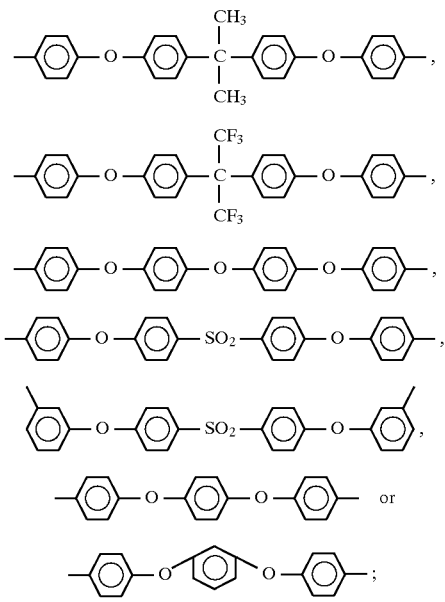

$R_2$ represents $-C_3H_6-$; $-C_4H_8-$; or

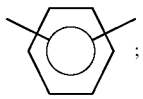

$R_3$ represents an aromatic silicon-free diamine residue; Ar represents an aromatic tetracarboxylic acid residue; n represents an integer of from 1 to 100; a and b represent numbers satisfying the relationship of a+b=1 and the relationship of $0.3 \leq a/(a+b) \leq 1.00$; and the polyimide of formulae (1) to (5) may be a random copolymer or a block copolymer.

16. The tape carrier for semiconductor device of claim 15, wherein in the formulae (1) to (5), a and b are numbers satisfying the relationship of a+b=1 and the relationship of $0.3 \leq a/(a+b) \leq 0.99$.

17. The tape carrier for semiconductor device of claim 15, wherein the surface layer of said high-molecular weight film is formed by a polyimide.

18. The tape carrier for semiconductor device of claim 15, wherein the external electrodes are formed on the back surface of said high-molecular weight film at a position corresponding to the portion almost just under said internal electrodes.

19. The tape carrier for semiconductor device of claim 15, wherein the external electrodes of said auxiliary wiring plate are formed at a portion deviated from the portion of the back surface of said high-molecular weight film corresponding to the portion almost just under said internal electrodes.

20. The tape carrier for semiconductor device of claim 15, wherein said high-molecular weight film has a multilayer structure composed of the laminated layers of a plurality of high-molecular weight films.

21. The tape carrier for semiconductor device of claim 15, wherein the area of the surface of the tape carrier for semiconductor device at the side of mounting the semiconductor chip is 200% or less of the bottom area of the semiconductor chip.

22. The tape carrier for semiconductor device of claim 15, wherein the area of the surface of the tape carrier for semiconductor device at the side of mounting the semiconductor chip is the same area as the bottom area of the semiconductor chip.

23. The tape carrier for semiconductor device of claim 15, wherein an insulating layer is formed on the back surface of the high-molecular weight film excluding the exposed surfaces of said external electrodes.

24. The tape carrier for semiconductor device of claim 15, wherein said insulating layer is formed by a polyimide.

25. A tape carrier for semiconductor device, wherein at least one leading conductor is disposed in the inside of a high molecular weight film, one end of the leading conductor forms an internal electrode projecting from the surface of said high-molecular weight film, the other end of said leading conductor forms an external electrode projecting from the back surface of said high-molecular weight film, the surface of said internal electrode is covered with a heat-welding polyimide film formed from one of heat-welding polyimides each represented by the following formulae (1) to (5), and said internal electrode projects from the surface of said heat-welding polyimide film;

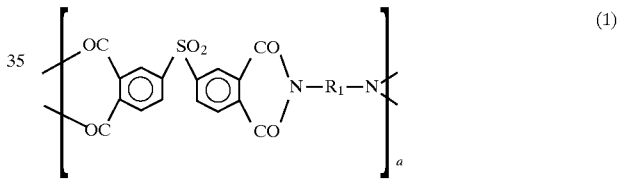

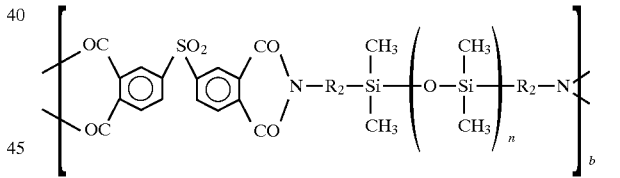

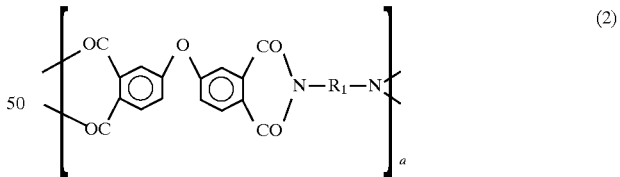

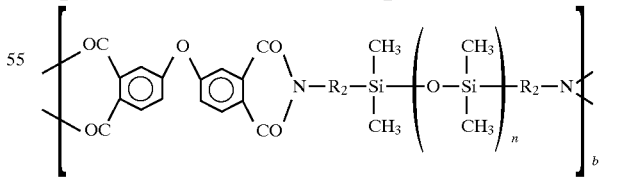

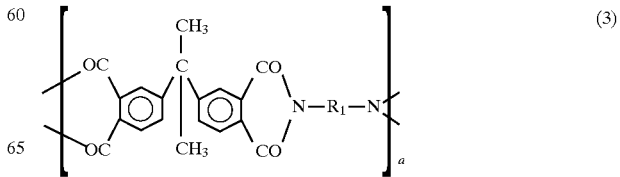

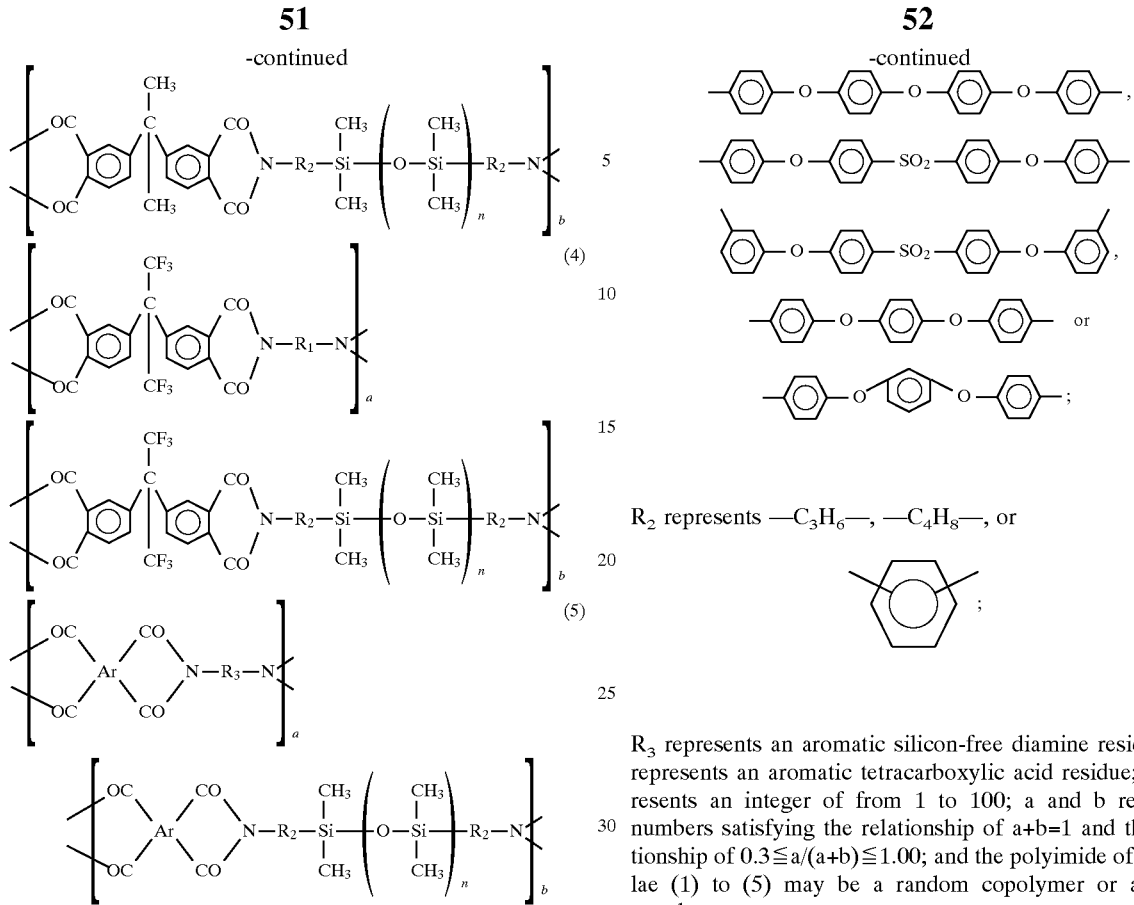

$R_2$ represents $-C_3H_6-$, $-C_4H_8-$, or $R_3$ represents an aromatic silicon-free diamine residue; Ar represents an aromatic tetracarboxylic acid residue; n represents an integer of from 1 to 100; a and b represent numbers satisfying the relationship of a+b=1 and the relationship of $0.3 \leq a/(a+b) \leq 1.00$; and the polyimide of formulae (1) to (5) may be a random copolymer or a block copolymer.

26. The tape carrier for semiconductor device of claim 25, wherein in the formulae (1) to (5), a and b are numbers satisfying the relationship of a+b=1 and the relationship of $0.3 \leq a/(a+b) \leq 0.99$.

27. The tape carrier for semiconductor device of claim 15, 16, 26 or 25, wherein said heat-welding polyimide film has a primer layer at the side of facing said high-molecular weight film and the primer layer is formed at least one of the polyimides represented by the following formulae (6) to (8).

In the formulae (6) to (8), $R_4$ represents

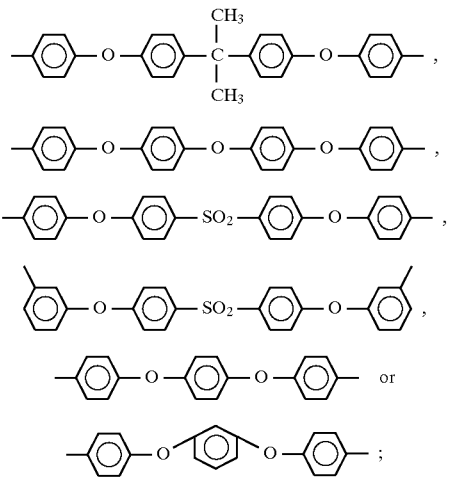

$R_2$ represents $-C_3H_6-$, $-C_4H_8-$, or

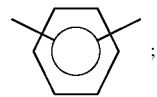

;

$R_3$ represents an aromatic silicon-free diamine residue; Ar represents an aromatic tetracarboxylic acid residue; n represents an integer of from 1 to 100; c and d represent numbers satisfying the relationship of c+d=1 and the relationship of $0.3 \leq c/(c+d) \leq 1.00$; and the polyimide of formula (6) to (8) may be a random copolymer or a block copolymer.

28. The tape carrier for semiconductor device of claim 27, wherein in the formulae (6) to (8), c and d are numbers satisfying the relationship of c+d=1 and the relationship of $0.3 \leq c/(c+d) \leq 0.99$.

* * * * *